(12) United States Patent
Mori et al.

(10) Patent No.: US 6,818,469 B2
(45) Date of Patent: Nov. 16, 2004

(54) THIN FILM CAPACITOR, METHOD FOR MANUFACTURING THE SAME AND PRINTED CIRCUIT BOARD INCORPORATING THE SAME

(75) Inventors: Toru Mori, Tokyo (JP); Akinobu Shibuya, Tokyo (JP); Shintaro Yamamichi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/445,330

(22) Filed: May 27, 2003

(65) Prior Publication Data

US 2003/0219956 A1 Nov. 27, 2003

(30) Foreign Application Priority Data

May 27, 2002 (JP) ........................................ 2002-152007

(51) Int. Cl.[7] .............................................. H01L 21/00
(52) U.S. Cl. ....................... 438/52; 438/239; 438/244; 438/250; 438/253; 438/381; 438/588; 438/652; 257/250; 257/303; 257/306; 257/331
(58) Field of Search ............................... 438/50, 52–53, 438/250–253, 239–244, 329, 381, 587–588, 652, 656; 257/303–308, 250, 331

(56) References Cited

U.S. PATENT DOCUMENTS

| | | | | |
|---|---|---|---|---|
| 5,529,831 | A | * 6/1996 | Waga et al. | 428/209 |
| 5,618,761 | A | * 4/1997 | Eguchi et al. | 438/785 |
| 5,818,079 | A | * 10/1998 | Noma et al. | 257/295 |
| 5,821,005 | A | * 10/1998 | Kijima et al. | 428/701 |
| 5,989,635 | A | * 11/1999 | Kawahara et al. | 427/255.32 |
| 6,392,265 | B2 | * 5/2002 | Kondo et al. | 257/295 |
| 6,649,954 | B2 | * 11/2003 | Cross | 257/295 |
| 2001/0026444 | A1 | * 10/2001 | Matsushima et al. | 361/763 |
| 2002/0022277 | A1 | * 2/2002 | Park et al. | 438/3 |
| 2002/0037624 | A1 | * 3/2002 | Mori et al. | 438/396 |
| 2003/0015754 | A1 | * 1/2003 | Fukumoto et al. | 257/315 |

FOREIGN PATENT DOCUMENTS

| | | | | |
|---|---|---|---|---|
| JP | 59-135714 | A | 8/1984 | |
| JP | 11-45955 | A | 2/1999 | |
| JP | 11-204734 | | * 11/1999 | ............ H01L/27/04 |
| JP | 2000-357631 | | * 12/1999 | ............ H01G/4/33 |
| JP | 2000-243873 | A | 9/2000 | |
| JP | 2000-277922 | A | 10/2000 | |
| JP | 2000-357631 | A | 12/2000 | |
| JP | 2001-77539 | A | 3/2001 | |
| JP | 2004-056097 | | * 5/2003 | ............ H01G/4/33 |

OTHER PUBLICATIONS

Najafi et al. "A novel technique and structure for the measurement of intrinsic stress and young's modulus of thin films" Micro–electro mech. systems, 1989, proceedings IEEE Feb. 20–22 p. 96–97.*

* cited by examiner

Primary Examiner—Matthew Smith
Assistant Examiner—Granvill D. Lee, Jr.
(74) Attorney, Agent, or Firm—Sughrue Mion, PLLC

(57) ABSTRACT

A thin film capacitor is provided with a substrate having a thickness equal to or more than 2 μm and equal to or less than 100 μm; a lower electrode on the substrate, which includes at least a highly elastic electrode and an anti-oxidation electrode on the highly elastic electrode; a dielectric thin film on the first lower electrode; and an upper electrode on the dielectric thin film; wherein the highly elastic electrode is made of a material having a Young's modulus higher than that of the anti-oxidation electrode.

35 Claims, 14 Drawing Sheets

51,52 FIXING FRAME
53 BASE FILM

THIN FILM CAPACITOR, METHOD FOR MANUFACTURING THE SAME AND PRINTED CIRCUIT BOARD INCORPORATING THE SAME

BACKGROUND OF THE INVENTION

1. Field of Invention

The present invention relates to a thin film capacitor formed on an insulating board. In particular, it relates to a thin film capacitor that is suitably mounted in an electronic circuit board made for example, but not by limitation, one of an organic material, a method for manufacturing the same, and a printed circuit board incorporating the thin film capacitor.

2. Description of the Related Art

Recently, there has been an increased market demand for a higher packaging density of passive components for a higher performance of electronic equipment. To meet such a demand, passive components have been downsized. For example, 1005-size passive components (L: 1.0 mm by W: 0.5 mm) were developed, and then 0603-size passive components (L: 0.6 mm by W: 0.3 mm) were developed. Furthermore, 0402-size passive components (L: 0.4 mm by W: 0.2 mm) are now being developed. On the other hand, there is a perception that further downsizing of such components is difficult technically. Under such circumstances, a technique of incorporating passive components into an electric circuit board to reduce the required area of the board is in the spotlight. In particular, since capacitors are used in the largest numbers among components of an electronic circuit, the area of the electronic circuit board can be effectively reduced if the capacitors are incorporated in the board.

Techniques of incorporating a capacitor into an electronic circuit board include a technique of inserting an electronic component in a cavity formed in a layer in a multilayer board, such as those disclosed in Japanese Patent Application 2000-243873A and Japanese Patent Application 11-45955A, and a technique of using an insulating layer in a multilayer board as a dielectric layer of a capacitor, such as those disclosed in Japanese Patent Application 2000-277922A and Japanese Application 2001-77539A. For the technique of using an insulating layer for a capacitor, in particular, a technique of making the insulating layer of a resin having a non-organic filler mixed therein to increase the relative dielectric constant thereof has been proposed.

However, in the case of inserting an electronic component in a cavity formed in a layer in a multilayer board, if the electronic component is a typical chip type component with a minimum thickness thereof at 0.3 mm, and is a minimum thickness of a prepreg used is 0.1 mm, the thickness of the board cannot be reduced to 0.5 mm or less even if one layer of the prepreg of the printed circuit board is overlaid on each of upper and lower sides of the component. On the other hand, in the case of using an insulating layer for a capacitor, the relative dielectric constant thereof is 2 to 4, and it is extremely difficult to increase the relative dielectric constant to 30 or more even if a non-organic filler is mixed therein. In addition, since the layer has a thickness of several tens $\mu$m at the minimum, the capacitance thereof can be only 9 pF at the maximum (it is assumed that the thickness of the insulating layer is 20 $\mu$m and the relative dielectric constant thereof is 20).

To eliminate the disadvantage described above, a thin film capacitor, which is thinner and has a higher capacitance per unit area than the chip type electronic component, has been prepared. There have been proposed a large number of techniques relating to the thin film capacitor, and many of them relate to a thin film capacitor formed on a rigid Si substrate or ceramic substrate. The thin film capacitor formed on the rigid substrate has an advantage that a forming temperature of a dielectric thin film thereof can be 500 to 600° C. or more, and thus, a dielectric material having a high relative dielectric constant can be used. On the other hand, it has a disadvantage that the thickness of the substrate is typically 0.1 mm or more, and thus, it is difficult to provide a thickness of the multilayer board including such a thin film capacitor, less than 0.5 mm. In addition, in the case where the thin film capacitor formed on the rigid substrate is incorporated in a resin board, such as a multilayer printed circuit board, there is the possibility that the rigid substrate is damaged due to thermocompression bonding in a manufacturing process of the resin board, for example, when manufacturing a multilayer printed circuit board.

To the contrary, a thin film capacitor formed on a flexible substrate, such as a resin substrate and metal foil, has an advantage that the substrate can be thinner and is not damaged due to thermocompression bonding in the manufacturing process of the multilayer printed circuit board. As for the thin film capacitor formed on the flexible substrate, Japanese Published Application 59-135714 A discloses a technique of providing a metal thin film on a flexible film made of an organic polymer and forming a highly dielectric thin film thereon.

Besides, as a method for incorporating a thin film capacitor in an insulating board, such as a printed circuit board, Japanese Published Application 2001-168534 A discloses a technique in which terminal electrodes are formed on both sides of the thin film capacitor on the flexible substrate and the terminal electrodes are connected to an internal electrode or external electrode of the insulating board a penetrating through hole. In this case, there is a problem in that, while a Cu layer formed on an inner surface of the through hole and the terminal electrodes of the thin film capacitor need to be electrically connected to each other, a sufficient reliability of the connection between the Cu layer on the inner surface of the through hole and the electrodes of the thin film capacitor cannot be assured since the lower and upper electrodes formed with a thin film device can have a thickness of 1 $\mu$m at the maximum.

As for another technique of the thin film capacitor formed on the flexible substrate Japanese Published Application 2000-357631 A discloses a technique of providing an adhesive film, preferably a metal oxide adhesive film, to make a flexible substrate made of an organic polymer or metal foil firmly adhere to a highly dielectric non-organic film and a metal electrode film in the flexible thin film capacitor.

In order to increase the reliability of the thin film capacitor having the highly dielectric thin film formed on the flexible substrate, such as an organic polymer film or metal foil, it is effective to enhance adhesions between the substrate and the metal film and between the substrate and the highly dielectric thin film as disclosed in Japanese Published Application 2000-357631 A.

However, in this case, the dielectric thin film itself is deformed and damaged because of a stress caused by, in the formation of the dielectric thin film, annealing the same at a temperature higher than the curing temperature of the resin.

Furthermore, when a resistance and an inductor are to be incorporated in a printed circuit board in addition to the thin film capacitor, if the printed circuit board is to incorporate one each of the passive components, that is, one capacitor, one resistor and one inductor, the incorporated passive components need to be at a certain distance from each other. Thus, there remains a problem to be solved about downsizing of the board incorporating the passive components.

SUMMARY OF THE INVENTION

It is therefore an object of the present invention to provide a thin film capacitor which can be mounted on a flexible substrate with high reliability. And another object of the present invention is to enable such a thin film capacitor to be mounted in the printed circuit board with high connection reliability.

According to a first aspect of the present invention, a thin film capacitor comprises a substrate having a thickness equal to or more than 2 μm and equal to or less than 100 μm, a lower electrode on the substrate, which includes at least a highly elastic electrode and an anti-oxidation electrode on the highly elastic electrode, a dielectric thin film on the lower electrode, and an upper electrode on the dielectric thin film, wherein the highly elastic electrode is made of a material having a Young's modulus higher than that of the anti-oxidation electrode.

According to such a highly elastic electrode, a stress which occurs when the dielectric thin film is formed can be reduced. Thus, there can be provided a thin film capacitor formed on the thin flexible substrate, because a highly elastic electrode can assist to relieve the stress caused when dielectric thin film is formed at a temperature higher than a curing temperature of a resin used for a substrate. As a result, it can be possible to provide a thin and high-capacity thin film capacitor with high reliability and to prevent the dielectric thin film itself from being damaged.

In addition, in order to attain the objects, according to the invention, there is provided a complex passive component characterized in that it has, formed on a same substrate, a thin film capacitor and either one or both of a thin film resistor and an inductor, the thin film capacitor having a lower electrode, a dielectric thin film and an upper electrode stacked on a substrate having a thickness equal to or more than 2 μm and equal to or less than 100 μm, and being characterized in that the lower electrode includes a first adhesion electrode in contact with the substrate, an anti-oxidation electrode in contact with the dielectric thin film and a highly elastic electrode made of a material having a Young's modulus higher than that of the anti-oxidation electrode and provided between the first adhesion electrode and the anti-oxidation electrode.

Furthermore, according to another aspect of the present invention, a thin film capacitor manufacturing method comprises forming a lower electrode on a substrate including forming a highly elastic electrode on the substrate and forming an anti-oxidation electrode on the highly elastic electrode, forming a dielectric thin film on the lower electrode, and forming a upper electrode on the dielectric thin film.

Furthermore, according to another aspect of the present invention, a printed circuit board incorporating a thin film capacitor according to the present invention, wherein the thin film capacitor is embedded in a resin substrate, the first lower electrode is connected electrically via any of a via hole or a through hole or a conductive pattern, and the first upper electrode is connected electrically via any of via hole or a through hole.

According to the printed circuit board of the present invention, a flexible substrate incorporating the high-capacity capacitor can be provided, because it can prevent the thin film capacitor from being damaged when it is incorporated in the printed circuit board. In addition, a printed circuit board incorporating the high-capacity capacitor can be thinned. In addition, since the thin film capacitor can be formed on the flexible substrate, the thin film capacitor can be prevented from being damaged when it is incorporated in the printed circuit board. In addition, since the thin film capacitor according to the invention can have a interconnecting pad electrode having a thickness of 1 μm or more formed therein, through-hole connection with a low resistance and high reliability which is not damaged by a thermal cycle can be realized.

DETAILED DESCRIPTION OF THE INVENTION

Figure 1A:
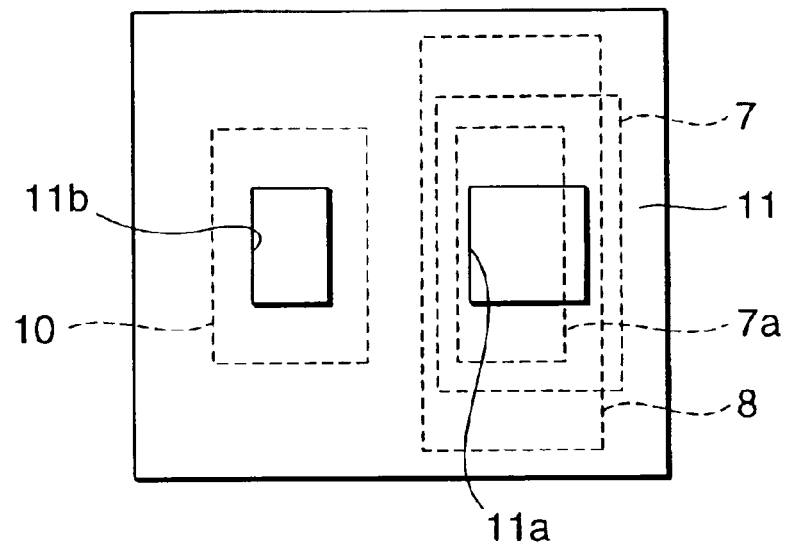
FIGS. 1(a) and 1(b) are plan view and cross-sectional view, respectively, showing a first embodiment of a thin film capacitor according to the invention.
Figure 1B:
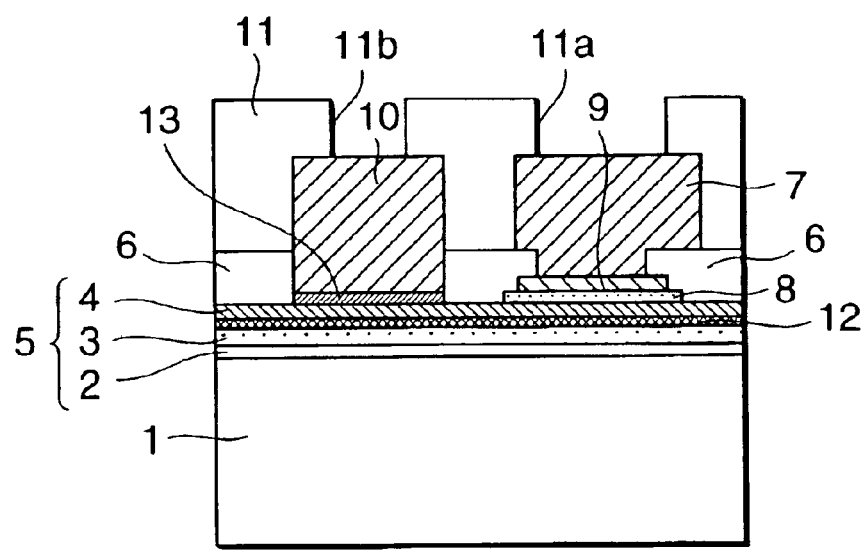

FIGS. 1(a) and 1(b) are a plan view and a cross-sectional view, respectively, showing a first embodiment of a thin film capacitor according to the invention. On a flexible substrate 1, a lower electrode 5, a dielectric thin film 8 and a upper electrode 9 are stacked to form a capacitor. The lower electrode 5 is composed of an anti-oxidation electrode 4 and a highly elastic electrode 3 under the anti-oxidation electrode 4.

The substrate 1 is made of a resin or metal preferably having but not required to have, a thickness of 2 to 100 μm, more preferably having a thickness of 10 to 70 μm. The substrate having a thickness of 100 μm or less is used because it is preferable when manufacturing a capacitor having a thickness of 0.1 mm or less. When incorporating the thin film capacitor in a printed circuit board, the thin film capacitor may be incorporated therein using a prepreg in mane cases. However, if it is assumed that the cured prepreg has a thickness on the order of 0.1 mm, the substrate used preferably has a thickness of 70 μm or less. In some cases if the substrate has a thickness equal to or less than 2 μm, the mechanical strength is insufficient and it may be difficult to handle the substrate in the manufacturing process. Therefore, the substrate will preferably have a thickness equal to or more than 2 μm. In order to assure a higher stability thereof in the manufacturing process, the substrate used preferably has a thickness of 10 μm or more.

The lower electrode 5 includes an anti-oxidation electrode 4 and a highly elastic electrode 3 under the anti-oxidation electrode 4.

The anti-oxidation electrode 4 is in contact with the highly dielectric thin film 8, and is made of an oxidation-resistive material, preferably any of Pt, Ru, $RuO_2$, $IrO_2$, Pd and Au.

The highly elastic electrode 3 has a modulus of elasticity (Young's modulus) higher than that of the anti-oxidation electrode 4. The highly elastic electrode 3 is provided to prevent the highly dielectric thin film 8 from being damaged under an external stress that can cause the flexible substrate 1 to be deformed. The highly elastic electrode 3 has preferably a thickness more than two times the thickness of the dielectric thin film 8. It is about 300 nm or more, more preferably a thickness of 400 nm or more. The thickness can have the effect to largely reduce stress which occurs when the dielectric thin film is formed on the flexible substrate at a temperature higher than a curing temperature of a resin used for a substrate. However, it is not advantageous to form the highly elastic electrode having a thickness of 1.5 μm or more. This is because if the highly elastic electrode is too thick, enhancement of the stress reduction effect cannot be expected and it takes a longer time to grow the film. Thus, since the dielectric thin film can be annealed at a high temperature without producing a high stress, a high capacitance density (approximately 30 $pF/mm^2$ or more) can be realized.

The highly elastic electrode 3 may be made of a metal having a modulus of elasticity (Young's modulus) higher than that of Pt (Young's modulus E=165 GPa), which is typically used for the anti-oxidation electrode 4. Specifically, it may be made of Mo, W, Ru or Ir. However, as far as the highly elastic electrode 3 has a modulus of elasticity (Young's modulus) higher than that of the anti-oxidation electrode and a high electrical conductivity, the material thereof is not limited the metals listed above and can contain any of Fe, Ni, Co, Ta or the like.

In addition, the lower electrode may include a first adhesion layer 2 under the highly elastic electrode 3. The first adhesion electrode 2 provides for enhancing adhesion to the flexible substrate 1. Furthermore, the lower electrode may include further a second adhesion layer 12 between the highly elastic electrode 3 and the anti-oxidation electrode 4 to enhance adhesion therebetween. The first adhesion layer and the second adhesion electrode may be made of any of Cr, Ti and Zr or the like. And an adhesion layer may be formed between the dielectric thin film 8 and the upper electrode 9 to enhance adhesion therebetween.

The dielectric thin film 8 may be made of a non-organic highly dielectric material. It is preferably selected from any of a non-organic composite oxide having a perovskite-type structure, for example, barium strontium titanate ((Ba, Sr)$TiO_3$), strontium titanate ($SrTiO_3$) and lead zirconate titanate (Pb(Zr, Ti)$O_3$), titanium oxide ($TiO_2$), tantalum oxide ($Ta_2O_5$) or the like.

The upper electrode 9 is examplary made of any of Pt, Au, Al, TiN, TaN.

The thin film capacitor of the present invention has a upper interconnecting pad electrode 7 and a lower interconnecting pad electrode 10 for connection with an external wiring. They may have a thickness of 1 μm or more, preferably 2.5 μm or more, respectively. Thus, electrical connection between the electrodes of the thin film capacitor and Cu layers formed on inner surfaces of through holes can be assured in a state where the thin film capacitor is incorporated in the resin substrate. If the thickness of the interconnecting pad electrode is below 1 μm, the probability that the electrical connection between the interconnecting pad electrode and the Cu plating on the inner surface of a penetrating through hole is lost may increase. Accordingly, it is preferable that the interconnecting pad electrode has a thickness of 1 μm or more. In this case, if a thick film electrode is formed on the thin film capacitor by electroplating or the like, the dielectric thin film would be subject to a higher stress. However, this stress is reduced since the highly elastic electrode is included in the lower electrode according to the invention, and the possibility that the dielectric thin film is damaged can be reduced.

Reference numeral 7a in FIG. 1(a) denotes a contact part of the upper interconnecting pad electrode 7 to be connected to the upper electrode 9. In order to adequately insulate the upper interconnecting pad electrode 7 from the lower interconnecting pad electrode 10 and the lower electrode 5 electrically connected thereto, whole of the upper interconnecting pad electrode 7 and the lower interconnecting pad electrode 10 excluding the respective contact regions may be covered with an insulating layer 6.

In addition, a third adhesion electrode 13 may be inserted between the lower electrode and the lower interconnecting pad electrode or between the upper electrode and the upper interconnecting pad electrode. It can assist to enhance adhesion therebetween.

A protective layer 11 made of a photo-sensitive resin and having a thickness of 1 to 5 μm may be formed at the top of the thin film capacitor. The protective layer 11 has openings 11a and 11b formed to allow parts of the interconnecting pad electrodes 7 and 10 to be exposed, respectively. These openings allow a probe of a measuring device to be brought into direct contact with the interconnecting pad electrode of the thin film capacitor when measuring the capacitance of the thin film capacitor. And the openings allow a conductive film of the printed circuit board to be brought into contact with the interconnecting pad electrode of the thin film capacitor when incorporating the thin film capacitor in the printed circuit board.

The interconnecting pad electrodes 7 and 10 are suitably made of Cu, Ni or the like that is suitable for a process capable of forming a thick film, such as plating, and the insulating layer 6 is suitably made of a photo-sensitive resin that can be readily patterned. If the highly elastic electrode 3 itself is made of an anti-oxidation material, the anti-oxidation electrode 4 may be omitted and the dielectric thin film may be formed on the highly elastic electrode 3 directly or with an adhesion layer interposed therebetween.

Figure 2A:
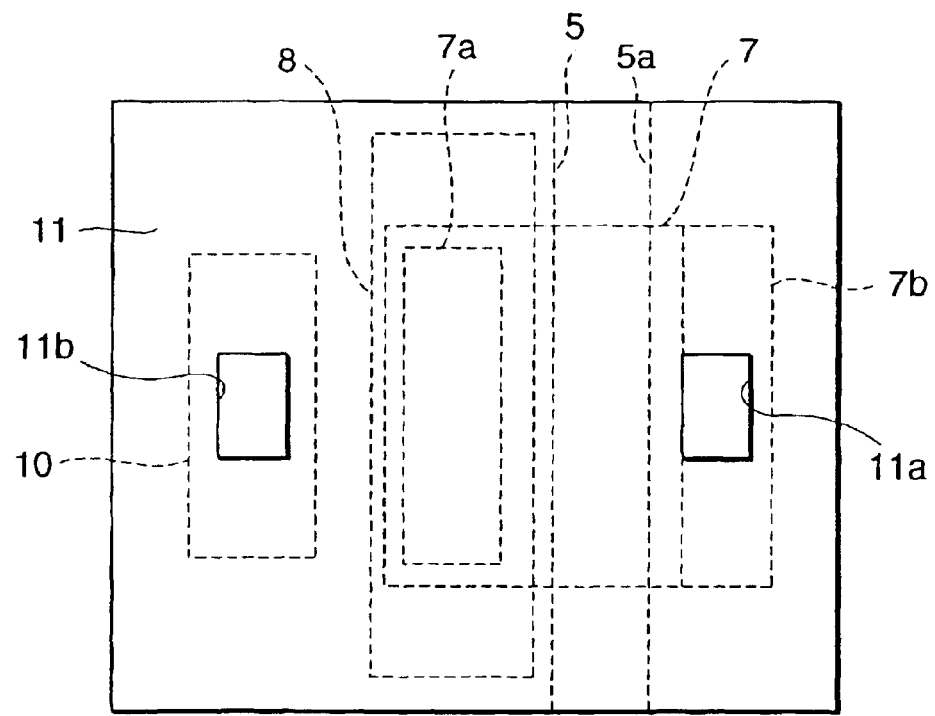
FIGS. 2(a) and 2(b) are plan view and cross-sectional view, respectively, showing a second embodiment of the thin film capacitor according to the invention.
Figure 2B:
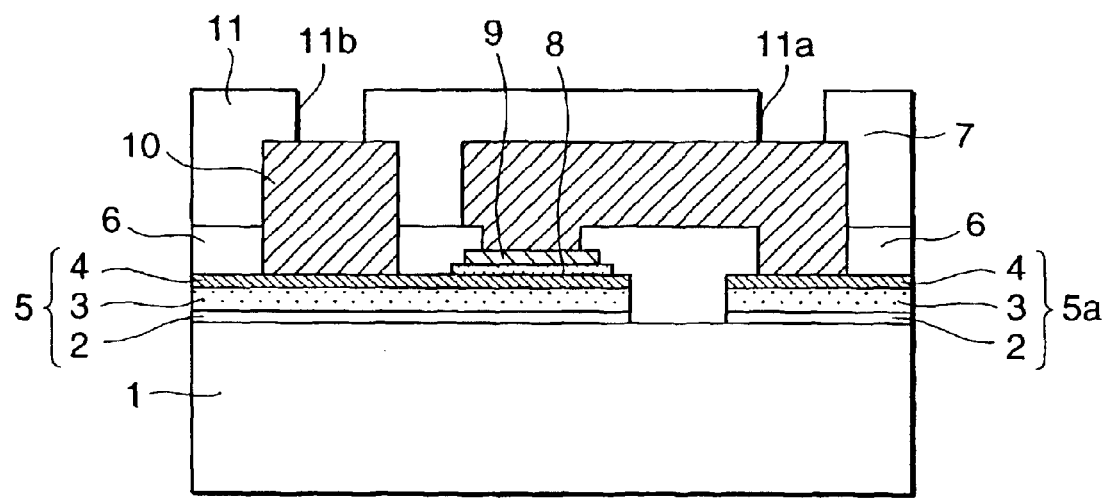
Figure 5:
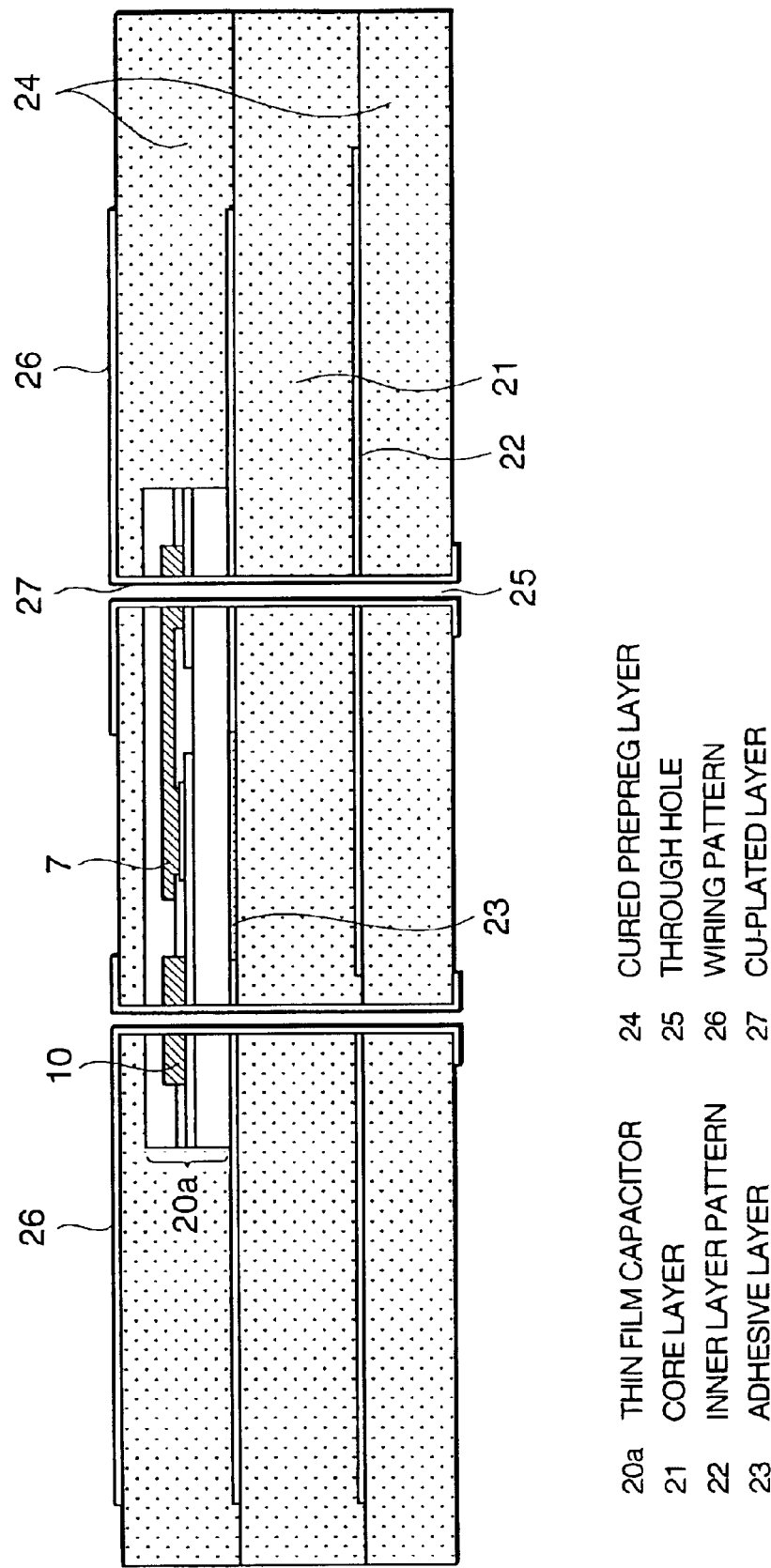
FIG. 5 is a cross-sectional view showing a first embodiment of a printed circuit board incorporating a thin film capacitor according to the invention.

FIGS. 2(a) and 2(b) are a plan view and a cross-sectional view, respectively, showing a second embodiment of the thin film capacitor according to the invention. In FIG. 2, parts equivalent to those in the first embodiment shown in FIG. 1 are assigned the same reference numerals, and overlaps of description will be avoided. This embodiment differs from the first embodiment of the thin film capacitor shown in FIG. 1 in that in addition to the lower electrode 5 in contact with the dielectric thin film 8, a interconnecting pad electrode receiver 5a is formed which is electrically insulated from the lower electrode 5. And it may have the same layered structure as the lower electrode 5. Then, the upper interconnecting pad electrode 7 extending from the upper electrode 9 is elongated to the interconnecting pad electrode receiver 5a. Since the upper interconnecting pad electrode 7 is thus horizontally elongated, there are disadvantages that the size of the thin film capacitor is larger than the thin film capacitor shown in FIG. 1, and the high frequency property may be degraded due to the increased length of the interconnecting pad electrode 7 connected to the upper electrode 9. However, there is an advantage that a through hole that is inexpensive in terms of processing can be used for electrical connection with a surface wiring layer when the thin film capacitor is incorporated in the printed circuit board because the upper interconnecting pad electrode 7 connected to the upper electrode 9 is not drawn directly above the first dielectric thin film 8. Such an arrangement is illustrated in FIG. 5 discussed hereinafter.

Furthermore, by connecting the interconnecting pad electrode 7 to the interconnecting pad electrode receiver 5a, the interconnecting pad electrode can be effectively prevented from peeling off when forming a through hole, compared to a case where the upper interconnecting pad electrode 7 is simply provided on the flexible substrate 1 or insulating layer 6. Here, reference numerals 7a and 7b in FIG. 2(a) denote contact parts of the upper interconnecting pad electrode 7 to be connected to the upper electrode 9 and the interconnecting pad electrode receiver 5a, respectively.

Figure 3:
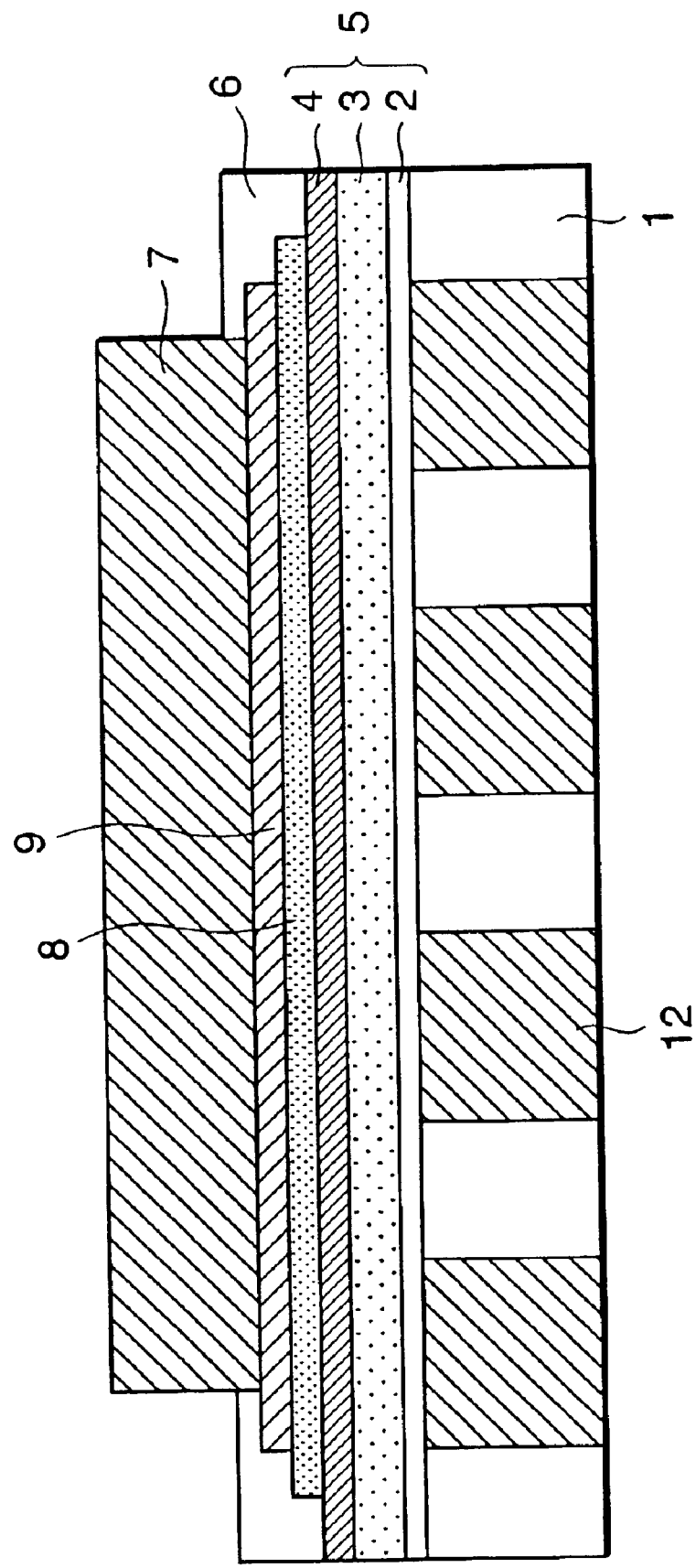
FIG. 3 is a cross-sectional view showing a third embodiment of the thin film capacitor according to the invention.

FIG. 3 is a cross-sectional view showing a third embodiment of the thin film capacitor of the invention. In FIG. 3, parts equivalent to those in the first embodiment shown in FIG. 1 are assigned the same reference numerals, and overlaps of description will be avoided. This embodiment differs from the first embodiment of the thin film capacitor shown in FIG. 1 in that at least one opening is formed in the flexible substrate 1, and the opening is filled with a conductive material which constitutes a lower interconnecting pad electrode 12 of the lower electrode 5.

The flexible substrate 1 having the interconnecting pad electrode 12 embedded therein like this can be formed in the following manner. A conductive post that constitutes the interconnecting pad electrode 12 is formed on a rigid provisional substrate made of glass, silicon, sapphire, ceramic, metal or the like by electroplating or thin film printing, or a metal film is applied to a provisional substrate and the metal film is etched to form a conductive post. Then, a substrate forming material, such as polyimide varnish, is applied thereto and cured to provide the flexible substrate 1. The surface thereof is planarized by CMP or the like, and then a capacitor is formed thereon. Once the capacitor is formed, the thin film capacitor is peeled off the provisional substrate, or the provisional substrate is removed by etching.

According to another method for forming the flexible substrate 1 having the interconnecting pad electrode 12 embedded therein, after the capacitor is formed on the flexible substrate 1, the substrate is selectively etched from the back side thereof or selectively removed by laser beam irradiation to form an opening, and then the opening is filled with a conductive paint or solder. Alternatively, a conductive layer plug is formed in the opening by electro-plating.

Figure 4:
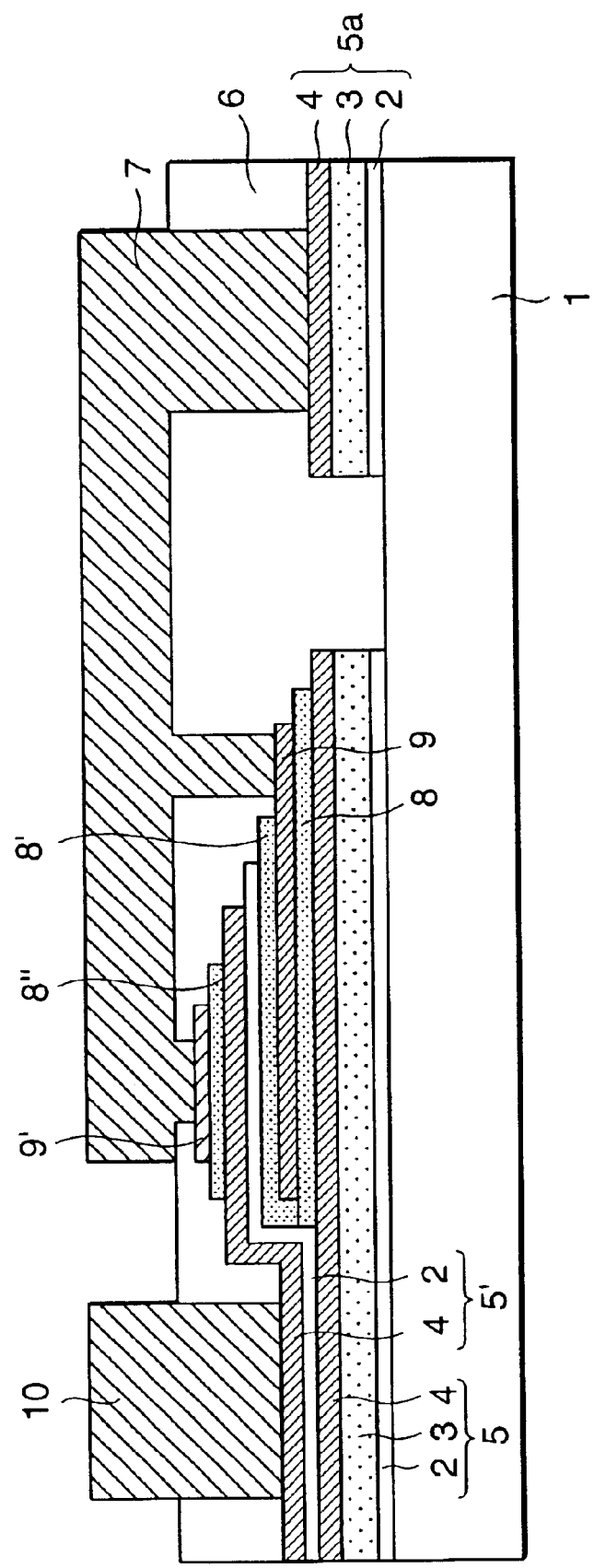
FIG. 4 is a cross-sectional view showing a fourth embodiment of the thin film capacitor according to the invention.

FIG. 4 is a cross-sectional view showing a fourth embodiment of the thin film capacitor of the invention. In FIG. 4, parts equivalent to those in the first and second embodiment shown in FIGS. 1 and 2 are assigned the same reference numerals, and overlaps of description will be avoided. This embodiment differs from the first embodiment of the thin film capacitor shown in FIG. 1 in that a second dielectric thin film 8', a second lower electrode 5', a third dielectric thin film 8" and the second upper electrode 9' are further stacked on the first upper electrode 9' the first lower electrode 5 and the second lower electrode 5' are connected in parallel to each other. And the first upper electrode 9 and the second upper electrode 9' are connected in parallel to each other by the upper interconnecting pad electrode 7.

According to this embodiment, the capacitance per unit area of the thin film capacitor can be increased. Since the thickness of the capacitor of the invention substantially depends on the thicknesses of the flexible substrate 1 and interconnecting pad electrode, the thickness of the capacitor is not significantly increased if the capacitor has such a multilayer structure. The number of the dielectric thin films stacked may be not limited to 2, it can contain more. In addition, though the first lower electrode 5 includes the highly elastic electrode in FIG. 4, it may exclude it provided sufficient elasticity is available by the use of the highly, elastic electrode 14 of lower electrode 5. The structure of the low electrode is not limited the structure indicated in FIG. 1. Also in the capacitor according to the third and fourth embodiments shown in FIGS. 3 and 4, the insulating protective layer may be formed on the surface thereof.

FIG. 5 is a cross-sectional view showing a first embodiment of a printed circuit board incorporating the thin film capacitor of the invention. This embodiment relates to a case where the thin film capacitor according to the invention is incorporated in a multilayer printed circuit board. The multilayer printed circuit board incorporating the thin film capacitor shown in FIG. 5 is fabricated in the following manner. To a core layer 21 having wirings of an inner layer pattern 22 formed on both sides, a thin film capacitor 20a according to the invention is secured with an adhesive layer 23 interposed therebetween. Then, a prepreg is disposed on the upper and lower surfaces of the core layer 21 and pressurized and heated to form cured prepreg layers 24. Then, through holes 25 penetrating the substrate are formed so as to penetrate the interconnecting pad electrodes 7 and 10 of the thin film capacitor, a wiring pattern 26 is formed on a surface of the cured prepreg layer 24, and Cu-plated layers 27 for connecting the wiring pattern 26 to the interconnecting pad electrodes 7, 10 and inner layer pattern 22 of the thin film capacitor 20a are formed on inner walls of the through holes.

Instead of forming the cured prepreg layer 24 and forming the wiring pattern only by etching, a copper foil may be provided on the cured prepreg layer 24 or a resin coated copper (RCC) may be applied thereto when the cured prepreg layer is adhered to the core layer, and then the wiring pattern may be formed in the copper foil layer. As is apparent from FIG. 5, it is essential that the thin film capacitor 20a used in this embodiment is thinner than the cured prepreg layer 24. Desirably, the thin film capacitor has a thickness generally equal to or less than 70% of that of the cured prepreg layer. Therefore, if the prepreg layer has a thickness of 0.1 mm, the allowable thickness of the thin film capacitor is 70 μm or less.

Figure 6:
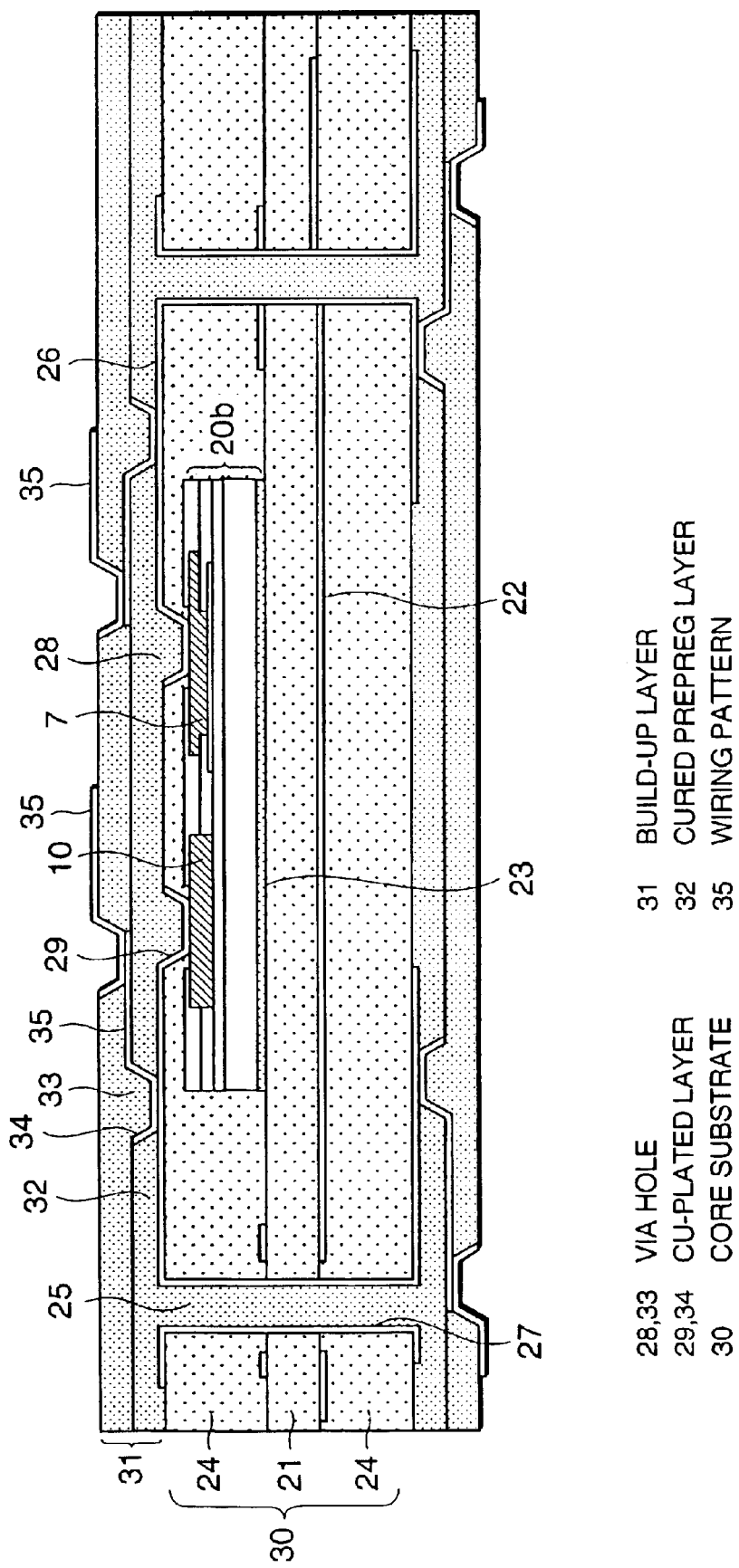
FIG. 6 is a cross-sectional view showing a second embodiment of a printed circuit board incorporating a thin film capacitor according to the invention.

FIG. 6 is a cross-sectional view showing a second embodiment of the printed circuit board incorporating the thin film capacitor of the invention. This embodiment relates to a case where the thin film capacitor of the invention is incorporated in a core substrate of a build-up substrate. A core substrate 30 is fabricated in the following manner. A thin film capacitor 20b according to the invention is adhered to a core layer 21 having a wiring pattern that constitutes an inner layer pattern 22, with an adhesive layer 23 interposed therebetween. A prepreg is disposed on the upper and lower surfaces of the core layer 21 and pressed and cured to form cured prepreg layers 24. A through hole 25 penetrating the core substrate is formed and via holes 28 that allow interconnecting pad electrodes 7 and 10 of the thin film capacitor 20b to be exposed are formed. A wiring pattern 26 is formed which is connected to the interconnecting pad electrodes 7, 10 of the thin film capacitor 20b via a Cu-plated layer 29 formed on inner walls of the via holes 28, and a Cu-plated layer 27 is formed on an inner wall of the through hole 25, whereby the wiring patterns 26 on front and back surfaces of the substrate are electrically connected to each other. A copper foil may be provided on the cured prepreg layer 24 when the cured prepreg layer is formed. Build-up layers 31 are formed on the front and back surfaces of the core substrate 30 thus fabricated. The build-up layers 31 are formed in such a manner that after a cured prepreg layer 32 is formed and a via hole 33 is formed, a process of forming a Cu-plated layer 34 covering a wiring pattern 35 and an inner wall of the via hole 33 is repeated once or a plurality of times.

In order to form the build-up layers 31, instead of the method of using the cured prepreg layer 32, there may be adopted a method of applying a thin insulating resin film to the core substrate, a method of applying a varnish to the core substrate and curing the same, or a method of forming the via hole simultaneously with the film formation by applying a photo-sensitive resin to the core substrate, exposing the same to light and developing the same. Alternatively, when the cured prepreg layer 32 is formed, a copper foil may be provided thereon.

Figure 7:
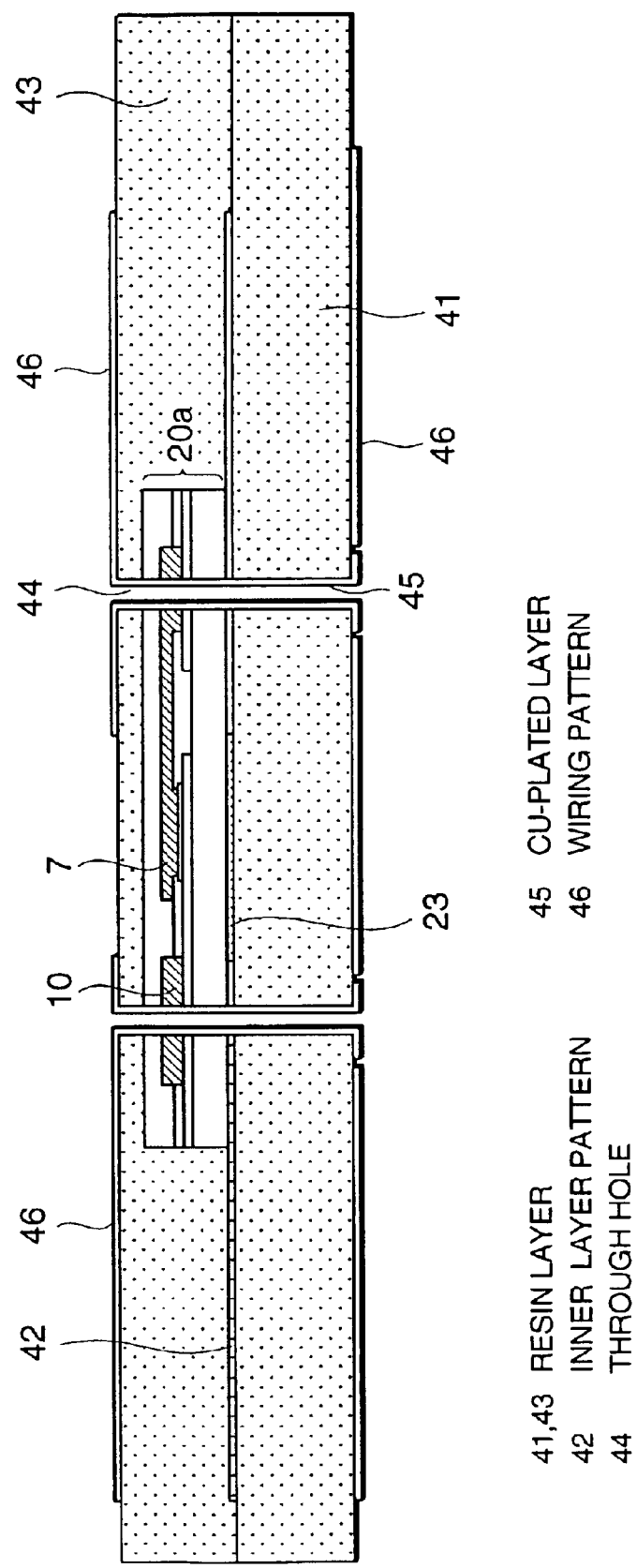
FIG. 7 is a cross-sectional view showing a third embodiment of a printed circuit board incorporating a thin film capacitor according to the invention.

FIG. 7 is a cross-sectional view showing a third embodiment of the printed circuit board incorporating the thin film capacitor of the invention. This embodiment relates to a case where the thin film capacitor of the invention is mounted in a flexible printed circuit board. To a resin layer 41 formed of a resin film, such as a polyimide film, having a wiring pattern that constitutes an inner layer pattern 42, a thin film capacitor 20a is secured with an adhesive layer 23 interposed therebetween, and a resin sheet is overlaid thereon and is subject to thermocompression to form a resin layer 43. Then, through holes 44 penetrating the substrate are formed, wiring patterns 46 are formed on front and back surfaces of the substrate, and Cu-plated layer 45 for connecting the wiring patterns 46 to the interconnecting pad electrodes 7, 10 of the thin film capacitor 20a and the inner layer pattern 42 are formed on inner walls of the through holes 44. The resin layer 43 may be formed by applying and curing a varnish. Alternatively, the resin layer 41 may be a film having a copper foil previously provided on a side where the inner layer pattern 42 thereof is not formed. Furthermore, the resin layer 43 also may be made of a resin layer with a copper foil.

According to this embodiment, the thin film capacitor is incorporated in the flexible substrate having a thickness of 100 μm or less that is composed of the resin layers 41, 43, and each of the resin layers has a thickness of about 50 μm or less. Therefore, the total thickness of the thin film capacitor is desirably equal to or less than 35 μm. In addition, the resin forming the resin layer 43 in which the thin film capacitor is embedded is desirably thermoplastic. However, as far as the thin film capacitor is not damaged during the process of integrating the resin layer and the thin film capacitor, the resin layer 43 may be a thermosetting resin. Furthermore, the wiring pattern on the surface of the resin layer 43 may be electrically connected to the interconnecting pad electrode 7 or 10 of the thin film capacitor via a via hole not penetrating the substrate.

Figure 8:
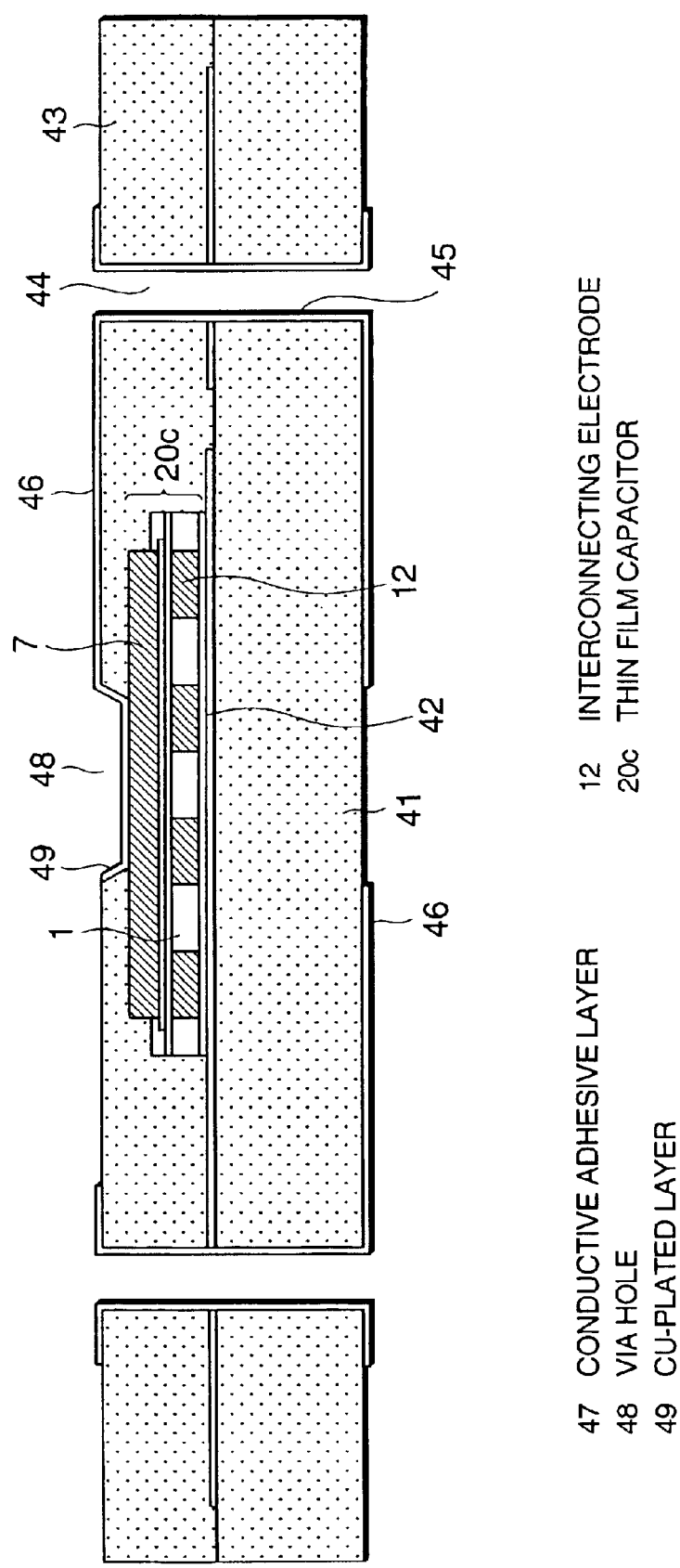
FIG. 8 is a cross-sectional view showing a fourth embodiment of a printed circuit board incorporating a thin film capacitor according to the invention.

FIG. 8 is a cross-sectional view showing a fourth embodiment of the printed circuit board incorporating the thin film capacitor of the invention. This embodiment relates to a case where a thin film capacitor with an electrode drawn from the back side according to the invention is mounted in a flexible printed circuit board. To an inner layer pattern 42 formed on a resin layer 41 formed of a resin film, such as a polyimide film, a thin film capacitor 20c is secured with a conductive adhesive layer made of solder, conductive paint or the like interposed therebetween, and a resin sheet is overlaid thereon and is subject to thermocompression to form a resin layer 43 so as to have the thin film capacitor 20c embedded therein. Then, a via hole 48 that allows a interconnecting pad electrode 7 of the thin film capacitor 20c to be exposed is formed, and a through hole 44 penetrating the substrate is formed. Then, a Cu-plated layer 49 is formed on an inner wall of the via hole 48, wiring patterns 46 are formed on front and back surfaces of the substrate, and a Cu-plated layer 45 for connecting the wiring patterns 46 to each other and to the inner layer pattern 42 is formed on an inner wall of the through hole 44. The resin layer 43 may be formed by applying and curing a varnish. Furthermore, the resin layer 41 may be a film having a copper foil previously provided on a side where the inner layer pattern 42 thereof is not formed. Furthermore, the resin layer 43 also may be made of a resin layer with a copper foil.

Figure 9A:
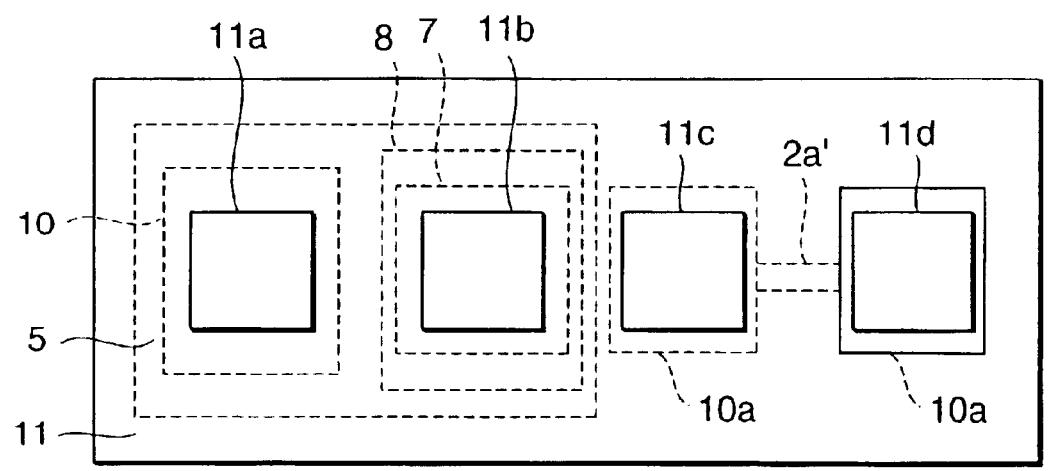
FIGS. 9(a) and 9(b) are a plan view and a cross-sectional view, respectively, showing a first embodiment of the complex passive component including a thin film capacitor of the invention.
Figure 9B:
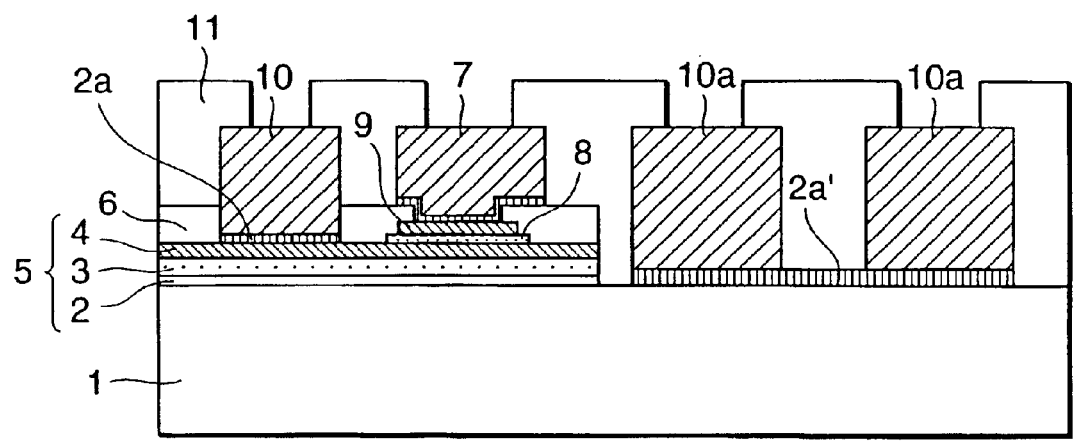

FIGS. 9(a) and 9(b) are a plan view and a cross-sectional view, respectively, showing a first embodiment of the complex passive component including a thin film capacitor of the invention. In FIG. 9, parts equivalent to those in the first and second embodiments of the thin film capacitor shown in FIGS. 1 and 2 are assigned the same reference numerals, and overlaps of description will be avoided. A thin film capacitor and a thin film resistor are formed on a same flexible substrate 1. The part shown in the left-hand side of the drawing constitutes a thin film capacitor identical with the first embodiment of the thin film capacitor shown in FIG. 1. Getting into the details, adhesion layers 2a are formed between the interconnecting pad electrodes 7, 10 and the upper electrode 9 and anti-oxidation electrode 4 of the lower electrode. The part shown in the right-hand side of the drawing constitutes a thin film resistor having a resistive body 2a' which is made of the same material as that of the adhesion layer 2a and formed concurrently therewith. A interconnecting pad electrode 10a is formed on the resistive body 2a'. As described above in the first to fourth embodiments, an insulating protective layer may be formed on the surface. In FIG. 9, both ends of the resistive body 2a' are shown as being aligned with the both ends of the interconnecting pad electrode 10a. However, it is essential only that the resistive body 2a' is in electrical contact with the interconnecting pad electrode 10a, so that they may not be aligned therewith. In addition, the distance between the right end of the lower electrode 5 of the thin film capacitor and the left end of the resistive body 2a' of the thin film resistor can be reduced to 20 μm.

Furthermore, FIG. 9 shows the thin film capacitor and the thin film resistor formed concurrently. However, the thin film capacitor and the thin film inductor may be formed concurrently, or alternatively, the thin film capacitor, the thin film resistor and the thin film inductor may be formed concurrently.

In the composite component including a thin film capacitor of the invention, the thin film capacitor and the thin film resistor or thin film inductor can be formed on one flexible substrate concurrently. Therefore, the distance between the passive components can be reduced to 20 μm, so that the incorporated passive components can be integrated with a higher density. The minimum distant, 20 μm, depends on the precision of a thick film process for forming the interconnecting pad electrode.

Figure 10:
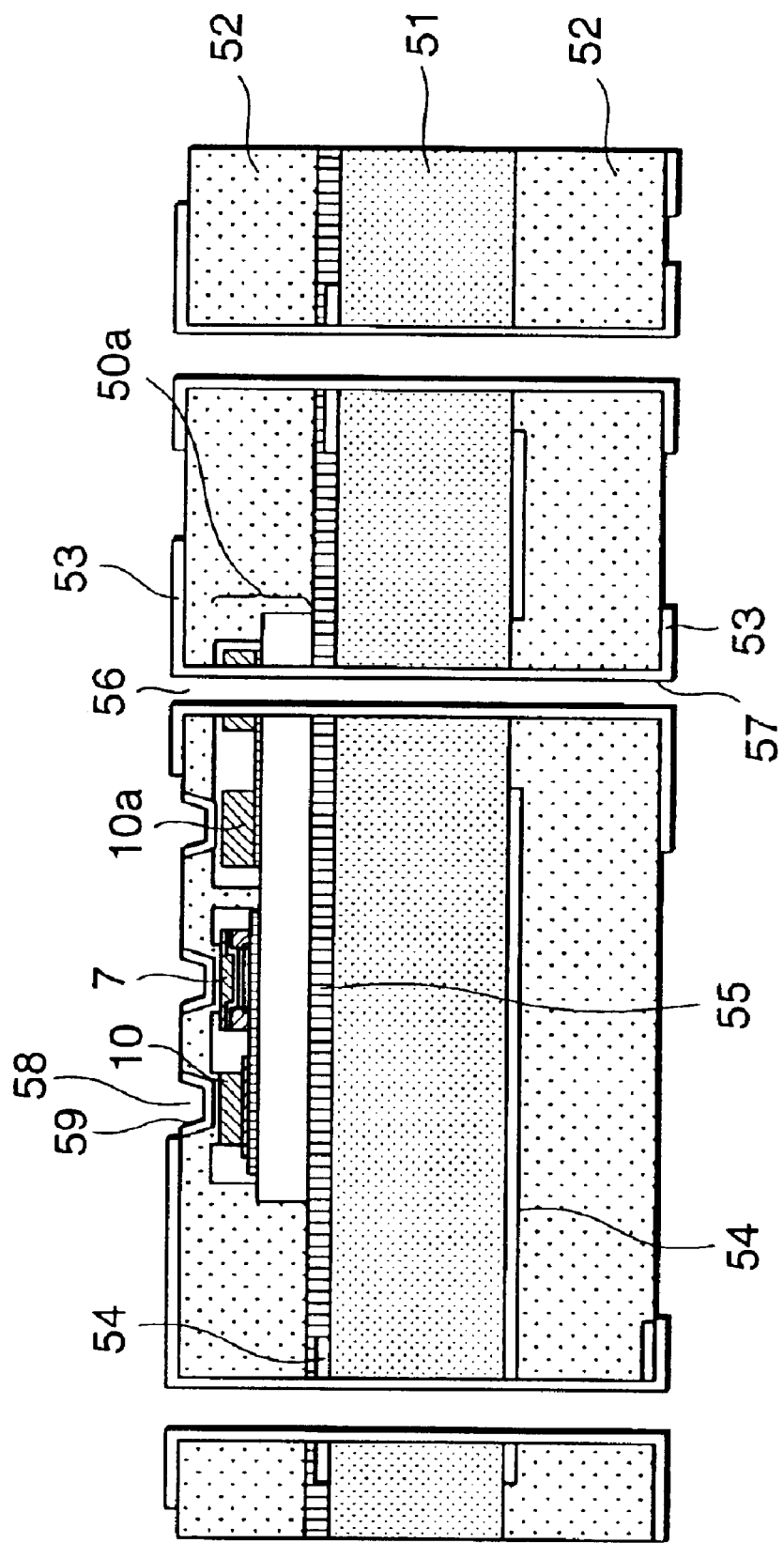
FIG. 10 is a cross-sectional view showing a first embodiment of a printed circuit board incorporating a passive component including a thin film capacitor of the invention.

FIG. 10 is a cross-sectional view showing a first embodiment of the printed circuit board incorporating a passive component including a thin film capacitor of the invention. This embodiment relates to a case where the composite component including the thin film capacitor of the invention is incorporated in a multilayer printed circuit board. The multilayer printed circuit board incorporating the thin film capacitor shown in FIG. 10 is fabricated in the following manner. To a core layer 51 having wirings of an inner layer pattern 54 formed on both sides, a composite component 50a having a thin film capacitor of the invention and a thin film resistor formed on a same substrate is secured with an adhesion layer 55 interposed therebetween. Then, a prepreg is disposed on the upper and lower surfaces of the core layer 51 and pressurized and heated to form cured prepreg layers 52. A through hole 56 penetrating the substrate is formed, and via holes 58 for exposing the surfaces of the interconnecting pad electrodes 7, 10 of the thin film capacitor and the surface of the interconnecting pad electrode 10a of the thin film resistor are formed. A wiring pattern 53 is formed which is connected to the interconnecting pad electrodes 7, 10 of the thin film capacitor via Cu-plated layers 59 formed on inner walls of the via holes 58, and a Cu-plated layer 57 is formed on an inner wall of the through hole 56, thereby electrically connecting the wiring on the front surface of the wiring substrate to the inner layer or the wiring on the back surface of the wiring substrate. When forming the cured prepreg layer 52, a copper foil may be provided thereon. As in the first embodiment of the wiring substrate incorporating the thin film capacitor of the invention, it is essential that the complex passive component including the thin film capacitor used in this embodiment is thinner than the cured prepreg layer 52.

Now, examples of the invention will be described in detail.

EXAMPLE 1

Figure 11A:
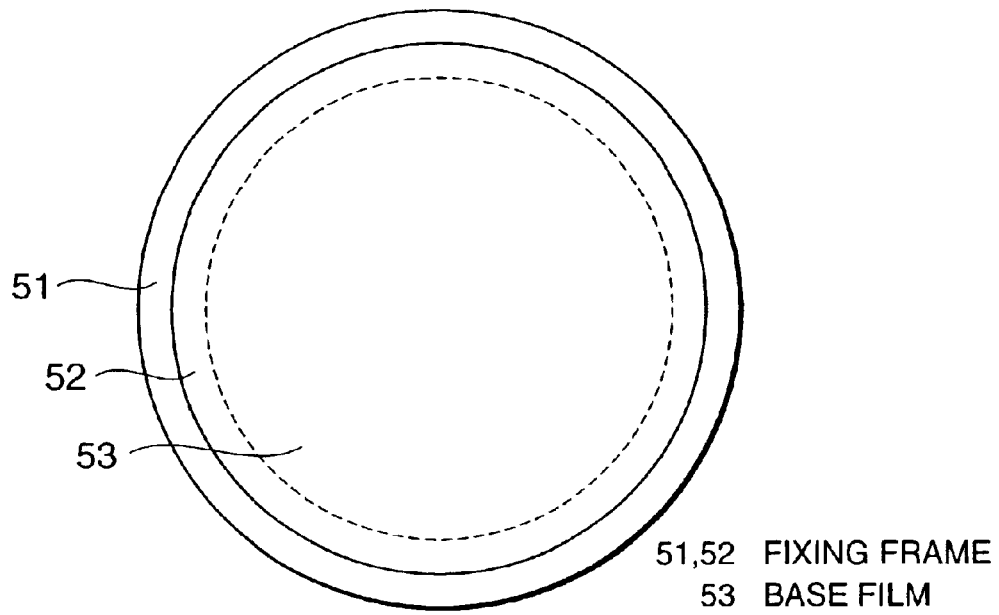
FIGS. 11(a) shows a top view and (b) shows cross-sectional view for illustrating a method for manufacturing the thin film capacitor according to the invention.
Figure 11B:

A commercially available polyimide film (50 μm thick) serving as a base film 53 was fixed to fixing frames 51, 52 made of stainless steel shown in FIG. 11. And then, this was introduced into a DC sputtering apparatus, in which Cr, W, Ti, and Pt were deposited on the film to a thickness of 20 nm, 500 nm, 20 nm and 250 nm, respectively. Here, Cr is intended for the first adhesion electrode (reference numeral 2 in FIG. 1), W is intended for the highly elastic electrode (3 in FIG. 1), Ti is intended for the second adhesion electrode (12 in FIG. 1), and Pt is intended for the anti-oxidation electrode (4 in FIG. 1). A strontium titanate ($SrTiO_3$) thin film (8 in FIG. 1) having a perovskite-type structure was deposited on the Pt electrode to a thickness of 200 nm by RF sputtering. And then, Pt was further deposited as the upper electrode (9 in FIG. 1) thereon to a thickness of 200 nm by DC sputtering. After the deposition, annealing was performed at a temperature of 400° C. Then, a resist film having a pattern of the upper electrode to be formed was formed by photolithography, and the Pt film was patterned by ion beam etching (IBE). Similarly, a resist film having a pattern of the highly dielectric film to be formed was formed by photolithography, and the $SrTiO_3$ film was patterned by chemical etching. In addition, a resist film was formed into a pattern of the lower electrode (5 in FIG. 1) to be formed by photolithography, and the lower electrode films (Pt, Ti, W and Cr films) were patterned by IBE.

Then, in order to assure that the interconnecting pad electrode (7 in FIG. 1) electrically connected to the upper electrode (9 in FIG. 1) is electrically insulated from the lower electrode (5 in FIG. 1), a photo-sensitive resin of epoxy resin was applied and patterned by exposure and development to form the insulating layer (6 in FIG. 1) having a thickness of about 2 μm. Then, Ti and Cu were deposited on the whole surface in this order by DC sputtering to a thickness of about 20 nm and about 100 nm, respectively, to form a plating base layer. The Ti layer is provided to enhance adhesion of the Cu layer, and Cr or Zr may be used for this purpose. Then, a resist film having openings corresponding to the interconnecting pad electrodes to be formed was formed by photolithography, and Cu was deposited in the openings to a thickness of 18 μm by electro-plating, whereby the interconnecting pad electrodes (7 and 10 in FIG. 1) were provided. The resist film was removed and the exposed plating base layer was removed by etching, and then, a photosensitive epoxy resin was applied to whole of the top surface, and then exposed to light and developed to form the protective layer (11 in FIG. 1) having a thickness of about 2 μm.

Figure 12:
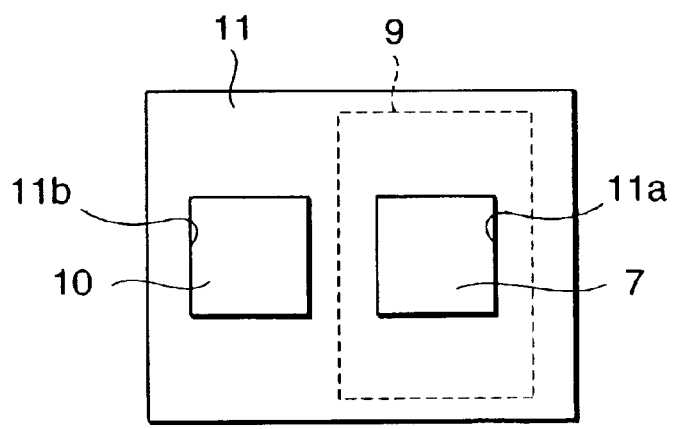
FIG. 12 is a top view of the thin film capacitor formed in Examples 1 and 2 of the invention.

After that, the base film was removed from the fixing frames 51, 52 and cut along the contour thereof to provide the individual thin film capacitor. FIG. 12 is a top view of the thin film capacitor thus fabricated. From above, only the protective layer 11 and the interconnecting pad electrodes 7, 10 exposed through the openings 11a, 11b of the protective layer can be indicated. Each of the openings 11a, 11b had a size of 0.5 mm square. A dashed line in FIG. 10 indicates the contour of the upper electrode 9, and the capacitance of the thin film capacitor depends on the area of the inside of the contour and the thickness of the highly dielectric thin film 8. The capacitance and dielectric loss of the thin film capacitor were measured by an LCR meter while varying the size of the upper electrode 9 of the thin film capacitor from 0.1 mm by 0.1 mm to 1 mm by 1 mm.

Using the following formula (1), the relative dielectric constant εr of the highly dielectric thin film 8 was determined from the measured capacitance. Then, values of εr ranging from 80 to 85 inclusive were resulted. The value of εr was higher for a smaller effective area S. The dielectric loss was 0.008 for a frequency f=1 kHz, and 0.010 for a frequency F=1 MHz.

This result shows that the resulting relative dielectric constant εr is substantially equal to that in the case where the thin film capacitor is formed on a rigid substrate, such as a Si wafer, and the resulting dielectric loss is a practical value.

$$\epsilon r = Cd/\epsilon_0 S \tag{1}$$

In this formula, symbol C indicates a capacitance (F), symbol d indicates a thickness of the highly dielectric thin film (m), symbol $\epsilon_0$ indicates a dielectric constant in a vacuum, and symbol S indicates an area of the upper electrode 9 (m$^2$).

EXAMPLE 2

As in example 1, a commercially available polyimide film (50 μm thick) was fixed to the fixing frames 51, 52 as shown in FIG. 9, and then, this was introduced into a DC sputtering apparatus, in which Cr, W, Ti, and Pt were deposited on the film to a thickness of 20 nm, 1000 nm, 20 nm and 250 nm, respectively. Here, Cr is intended for the first adhesion electrode (reference numeral 2 in FIG. 2), W is intended for the highly elastic electrode (3 in FIG. 2), Ti is intended for the second adhesion electrode (not shown, located between the parts 3 and 4 in FIG. 2), and Pt is intended for the anti-oxidation electrode (4 in FIG. 2). A lead lanthanum zirconate titanate (($Pb_{0.94}La_{0.06}$)($Zr_{0.5}Ti_{0.5}$)$O_3$) thin film (8 in FIG. 2) having a perovskite-type structure was deposited on the Pt electrode to a thickness of 200 nm by a sol-gel process, and Pt for the upper electrode (9 in FIG. 2) was further deposited thereon to a thickness of 200 nm by DC sputtering. After the deposition, the lead lanthanum zirconate titanate was annealed at a temperature of 450° C. Then, a resist film having a pattern of the upper electrode to be formed was formed by photolithography, and the Pt film was patterned by ion beam etching (IBE). Similarly, a resist film was formed by photolithography, and the lead lanthanum zirconate titanate film was patterned by chemical etching. In addition, a resist film was formed by photolithography, and the lower electrode films (Pt, Ti, W and Cr films) were patterned by IBE to provide the lower electrode (5 in FIG. 2) and the interconnecting pad electrode receiver (5a in FIG. 2).

The insulating layer (6 in FIG. 2), the interconnecting pad electrodes (7, 10 in FIG. 2) and the protective layer (11 in FIG. 2) were formed in the same manner as that described in Example 1. The capacitance and dielectric loss of the thin film capacitor were measured by an LCR meter while varying the size of the upper electrode of the thin film capacitor from 0.1 mm by 0.1 mm to 1 mm by 1 mm, as in Example 1, and the relative dielectric constant $\epsilon r$ was calculated according to the formula (1). Then, values of $\epsilon r$ ranging from 270 to 320 inclusive were resulted. Although these values are higher than those obtained for the strontium titanate thin film in Example 1, they are much lower than the relative dielectric constant ($\epsilon r=800$ to 1000) of the lead lanthanum zirconate titanate thin film formed on a rigid substrate, such as a Si wafer. This is presumed to be due to the fact that the annealing temperature is low. Here, the dielectric loss was 0.02 for a frequency f=1 kHz, and 0.035 for a frequency F=1 MHz.

EXAMPLE 3

This example relates to the capacitor with an electrode drawn from the back side shown in FIG. 3. Ti/Cu was deposited on a silicon substrate by electron beam deposition to provide the plating base layer, a resist film having an opening at a region where the interconnecting pad electrode 12 is to be formed was formed by photolithography, and a conductive post having a thickness of 25 μm intended for the interconnecting pad electrode 12 was formed by electroplating. The resist film was removed, and then the exposed plating base layer was removed. Then, a polyimide varnish was applied to the substrate by spin coating, and the applied varnish was subject to predetermined drying and curing processes, resulting in the flexible substrate 1. The interconnecting pad electrode 12 preferably has a thickness slightly larger than that of the flexible substrate 1. Then, the interconnecting pad electrode 12 was polished to eliminate any difference in height between the interconnecting pad electrode 12 and the flexible substrate 1. The first adhesion electrode 2 (Ti), the highly elastic electrode 3 (Ru) and the anti-oxidation electrode 4 (Pd) were deposited by sputtering on the flexible substrate 1 having the interconnecting pad electrode 12 embedded therein to thicknesses of 50 nm, 400 nm and 200 nm, respectively, to provide the lower electrode 5. Tantalum oxide ($Ta_2O_5$) was deposited on the anti-oxidation electrode 4 by CVD to a thickness of 50 nm to provide the highly dielectric thin film 8. On the highly dielectric thin film 8, Pt intended for the upper electrode 9 was deposited to a thickness of 150 nm by sputtering. After the deposition, the Pt film intended for the upper electrode 9 and the highly dielectric thin film 8 were patterned by photolithography, and the insulating layer 6 was formed. Then, the interconnecting pad electrode 7 was formed on the upper electrode 9 in the same manner as in Example 1. Finally, the silicon substrate, which is a provisional substrate, was peeled off and the flexible substrate was separated into individual capacitors.

EXAMPLE 4

This example relates to the stack-type capacitor shown in FIG. 4. A polyimide film having a thickness of 30 μm intended for the flexible substrate 1 was fixed to a silicon wafer by means of a highly heat resistant adhesive. Instead of silicon, the substrate may be made of sapphire, ceramic or metal so far as it is rigid. On the polyimide film, the adhesion electrode 2 (Ti), the highly elastic electrode 3 (W) and the anti-oxidation electrode 4 (Pt) were deposited by sputtering to thicknesses of 20 nm, 500 nm and 250 nm, respectively, to provide the lower electrode 5. On the Pt electrode, a lead zirconate titanate (Pb($Zr_{0.5}Ti_{0.5}$)$O_3$) thin film having a perovskite-type structure was deposited as the highly dielectric thin film 8 to a thickness of 200 nm by a sol-gel process, the thin film was patterned by photolithography. Pt intended for the upper electrode 9 was further deposited thereon to a thickness of 200 nm, and the Pt layer was patterned. Patterning of the upper electrode 9 can be performed by photo-etching or lift-off method. Then, lead zirconate titanate thin film intended for the second highly dielectric thin film 8' was formed to a thickness of 200 nm by a sol-gel process, and the thin film was patterned by photolithograpy. After that, the adhesion electrode 2 (Ti: 20 nm) and the anti-oxidation electrode 4 (Pt: 250 nm) were deposited by sputtering and patterned to provide the second lower electrode 5'. Patterning of the lower electrode 5' can be performed by photo-etching or lift-off method. Then, lead zirconate titanate thin film intended for the third highly dielectric thin film 8" was further formed to a thickness of 200 nm by a sol-gel process, and the thin film was patterned by photolithograpy. After that, Pt was deposited to a thickness of 200 nm by sputtering and the deposited Pt layer was patterned similarly to provide the second upper electrode 9'. Beside, the lowermost electrode layer was patterned to provide the lower electrode 5 and the interconnecting pad electrode 5a. Patterning of the lowermost electrode layer may be performed before forming the first highly dielectric thin film 8. In such a case, the lift-off method may be adopted for patterning. The lead zirconate titanate thin film was collectively annealed at 450° C., and then the insulating layer 6 made of a photosensitive epoxy resin was formed, and then, the interconnecting pad electrodes 7, 10 mainly made of Cu were formed in the same manner as in Example 1. Finally, the flexible substrate was peeled off the silicon wafer and separated into individual thin film capacitors.

COMPARISON EXAMPLE

Figure 13:
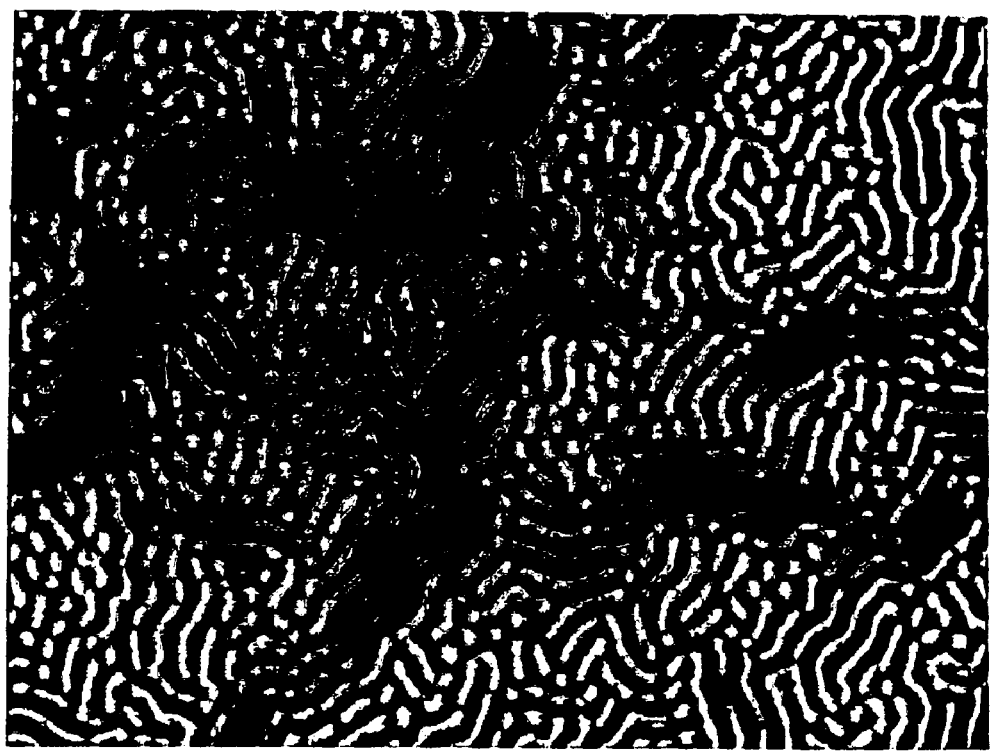
FIG. 13 is a metallurgical microscopic photograph showing a surface condition of a highly dielectric thin film after the film is formed in a process of manufacturing the thin film capacitor according to a comparison example.

A thin film capacitor having a strontium titanate thin film as the highly dielectric thin film 8 was fabricated in the same process as in the Example 1. This comparison example differs from Example 1 in the layered structure of the lower electrode 5. In this comparison example, the lower electrode was composed of a Ti layer (20 nm) and a Pt layer (500 nm). Here, Ti was intended for the adhesion electrode (2 in FIG. 1), Pt was intended for the anti-oxidation electrode (4 in FIG. 1), and any electrode intended for the highly elastic electrode 3 was not provided. At a point in time when the strontium titanate film intended for the highly dielectric thin film 8 was deposited on the lower electrode 5 and annealed, "wrinkles" as shown in FIG. 13 were observed in the dielectric thin film. After that, measurement of the capacitance and dielectric loss of the thin film capacitor was enabled in the same process as in Example 1, and the measurement was performed on 20 thin film capacitors. Then, all of the thin film capacitors were proved to have a short-circuit failure. This short-circuit is presumed to be due to the fact that a stress produced when the highly dielectric thin film is formed causes the wrinkles to occur in the flexible substrate 1, thereby producing a crack or the like in the highly dielectric thin film 8.

EXAMPLE 5

A printed circuit board incorporating the thin film capacitor fabricated in Example 2 was fabricated in the following manner. As shown in FIG. 5, the thin film capacitor 20*a* was adhered, using the insulating adhesive 23, to one surface of the core substrate 21 having a thickness of 0.4 to 0.6 mm having wiring patterns formed on the both surfaces, thereby providing the core substrate of the multilayer printed circuit board. Then, a copper-clad prepreg or resin coated copper (RCC) not containing a glass cloth having a thickness of 0.1 to 0.3 mm was disposed on the core substrate and integrated therewith by thermocompression. Then, through holes 25 having a diameter of 0.3 to 0.35 mm penetrating the substrate were formed by means of a drill. Then, in a general method for forming a plated through hole, an activation process, electroless plating, electroplating and selective etching were performed to form the wiring pattern 26, and the Cu-plated layer 27 having a thickness of 18 to 30 $\mu$m was formed on the inner walls of the through holes 25. The capacitance and dielectric loss of the incorporated thin film capacitor were measured by the LCR meter with a prove being in contact with the wiring patterns 26. Then, the capacitance of the thin film capacitor was 2080 pF and the dielectric loss thereof was 0.012 (both for a frequency f=1 kHz, and the values being a mean value for twenty points), while the capacitance of the thin film capacitor before being incorporated in the printed circuit board had been 2250 pF and the dielectric loss thereof had been 0.01 (both for a frequency f=1 kHz, and the values being a mean value for twenty capacitors). Thus, it can be said that the values of the capacitance and dielectric loss before and after the thin film capacitor is incorporated in the board are substantially the same.

EXAMPLE 6

A multilayer build-up substrate incorporating the thin film capacitor fabricated in Example 1 was fabricated in the following manner. The core substrate 30 as shown in FIG. 6 was fabricated in the same manner as the multilayer printed circuit board described in Example 5. However, unlike the Example 5, the via holes 28 that allow the interconnecting pad electrodes 7 and 10 of the thin film capacitor 20*a* to be exposed are formed using laser beam, and the Cu-plated layers 29 formed on the inner walls of the via holes provide electrical connection between the interconnecting pad electrodes 7, 10 and the wiring pattern 26. As for the interconnecting pad electrode 10 of the thin film capacitor 20*b*, since it is not located directly above the highly dielectric thin film 8 and the lower electrode 5, it may be electrically connected to the wiring pattern 26 or inner layer pattern 22 by means of a penetrating through hole instead of the via hole. A photosensitive insulating resin was applied to the upper and lower sides of the core substrate 30 incorporating the thin film capacitor 20*b*, the applied resin was exposed to light and developed to provide the insulating layer having a via hole 33 formed therein (equivalent to the cured prepreg layer 32), and the Cu-plated layer 34 and the wiring pattern 35 were formed, thereby providing one build-up layer. Then, this process was repeated a required number of times to form the build-up layer 31, thereby providing the build-up substrate incorporating the thin film capacitor.

The capacitance and dielectric loss of the thin film capacitor incorporated in the substrate were measured by the LCR meter with a prove being in contact with the wiring patterns 35 on the surfaces of the build-up substrate. Then, the capacitance of the thin film capacitor was 850 pF and the dielectric loss thereof was 0.01 (both for a frequency f=1 kHz, and the values being a mean value for twenty points), while the capacitance of the thin film capacitor before being incorporated in the substrate had been 880 pF and the dielectric loss thereof had been 0.008 (both for a frequency f=1 kHz, and the values being a mean value for twenty capacitors). Thus, if the thin film capacitor is incorporated in the build-up substrate, it can be said that the values of the capacitance and dielectric loss before and after the thin film capacitor is incorporated in the substrate are substantially the same.

EXAMPLE 7

The thin film capacitor fabricated in Example 2 was incorporated in a flexible printed circuit board in the following manner. As shown in FIG. 7, the thin film capacitor 20*a* was fixed, using the adhesive 23, to a polyimide film (resin layer 41) having a thickness of about 50 $\mu$m having a copper foil on one side and a wiring pattern which constitutes the inner layer pattern 42 previously formed on the other side. A thermoplastic resin film having a thickness of 50 to 70 $\mu$m having one side thereof coated with Cu was overlaid on the polyimide film with the side not coated with Cu being in contact with the thin film capacitor and integrated with the polyimide film by thermocompression. Thus, the resin layer 43 was formed. The through holes 44 were formed by means of a drill, and then, in a general method for forming a plated through hole, the wiring pattern 46 was formed on each of the front and back sides of the substrate, and the Cu-plated layers 45 were formed on the inner walls of the through holes 44. Here, while the flexible substrate 1 serving as a base of the incorporated thin film capacitor has a thickness of 50 $\mu$m in Example 2, the flexible substrate 1 has a thickness of 20 $\mu$m in this example, so that the total thickness of the thin film capacitor is equal to or less than 35 $\mu$m.

The capacitance and dielectric loss of the incorporated thin film capacitor were measured with a prove being in contact with the wiring patterns 46 on the surface of the substrate. Then, an insufficient insulation was proved to occur at two points of the twenty measurement points. By presumption, since the flexible substrate 1 of the thin film capacitor is thinner than those in Examples 1 and 2, and the resin layer 43 is thinner than the cured prepreg layer 24 in Example 5 or 4, the highly dielectric thin film 8 of the thin film capacitor is subject to a higher stress in a thermocompression process, resulting in a dielectric breakdown. However, the substrates incorporating the capacitor which are free of insufficient insulation can be provided at a yield of 90%. The capacitance of the thin film capacitor after being incorporated in the substrate was 1960 pF and the dielectric loss thereof was 0.012 (both for a frequency f=1 kHz, and the values being a mean value for eighteen points), while the capacitance of the thin film capacitor before being incorporated in the substrate had been 2250 pF and the dielectric loss thereof had been 0.01 (both for a frequency f=1 kHz, and the values being a mean value for twenty capacitors). The result was that the decrease of the capacitance of the thin film capacitor due to incorporation in the substrate was slightly larger than Example 5.

EXAMPLE 8

Figure 14:
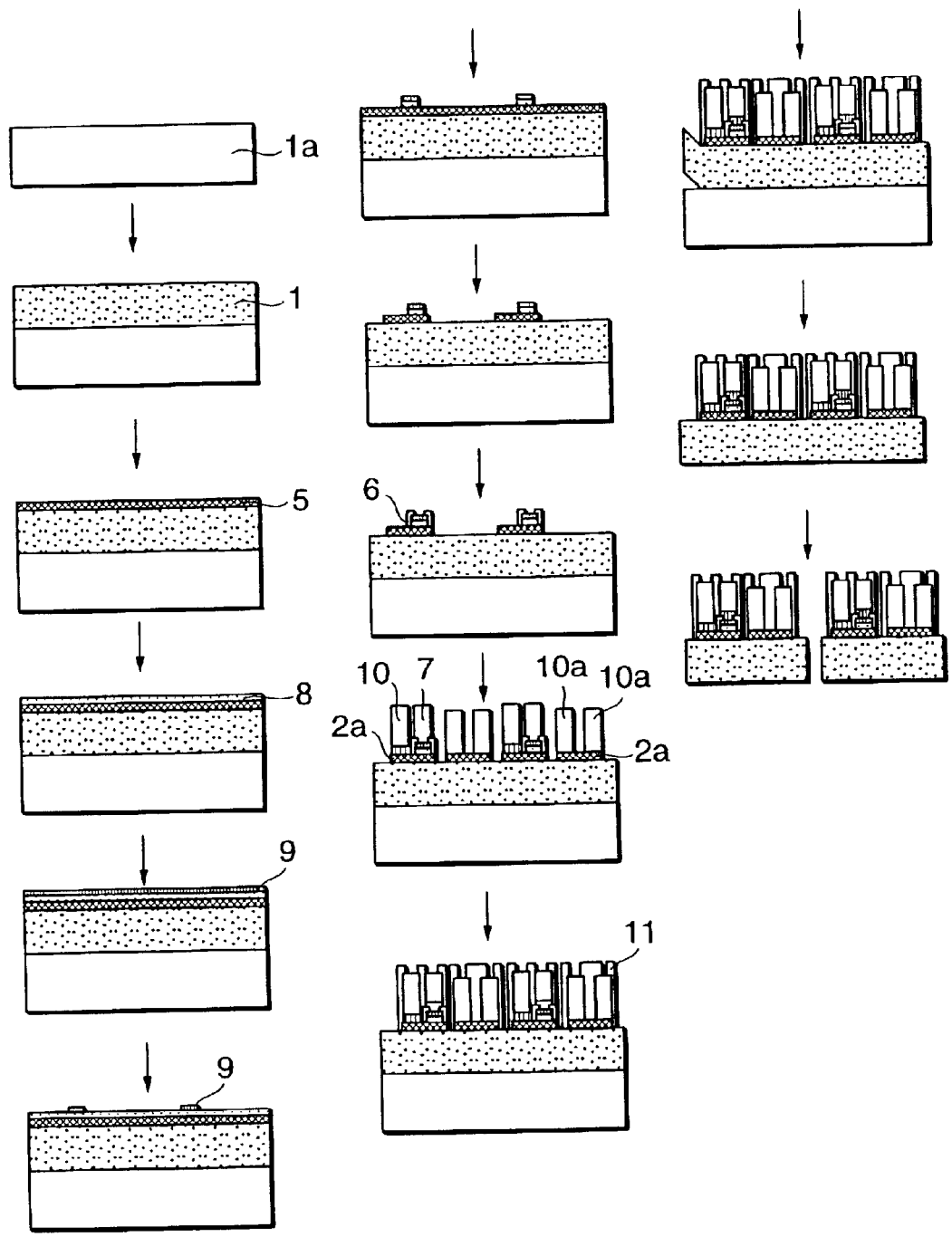
FIG. 14 is a flowchart illustrating a method for manufacturing a complex passive component shown in Example 8 of the invention.
Figure 15:
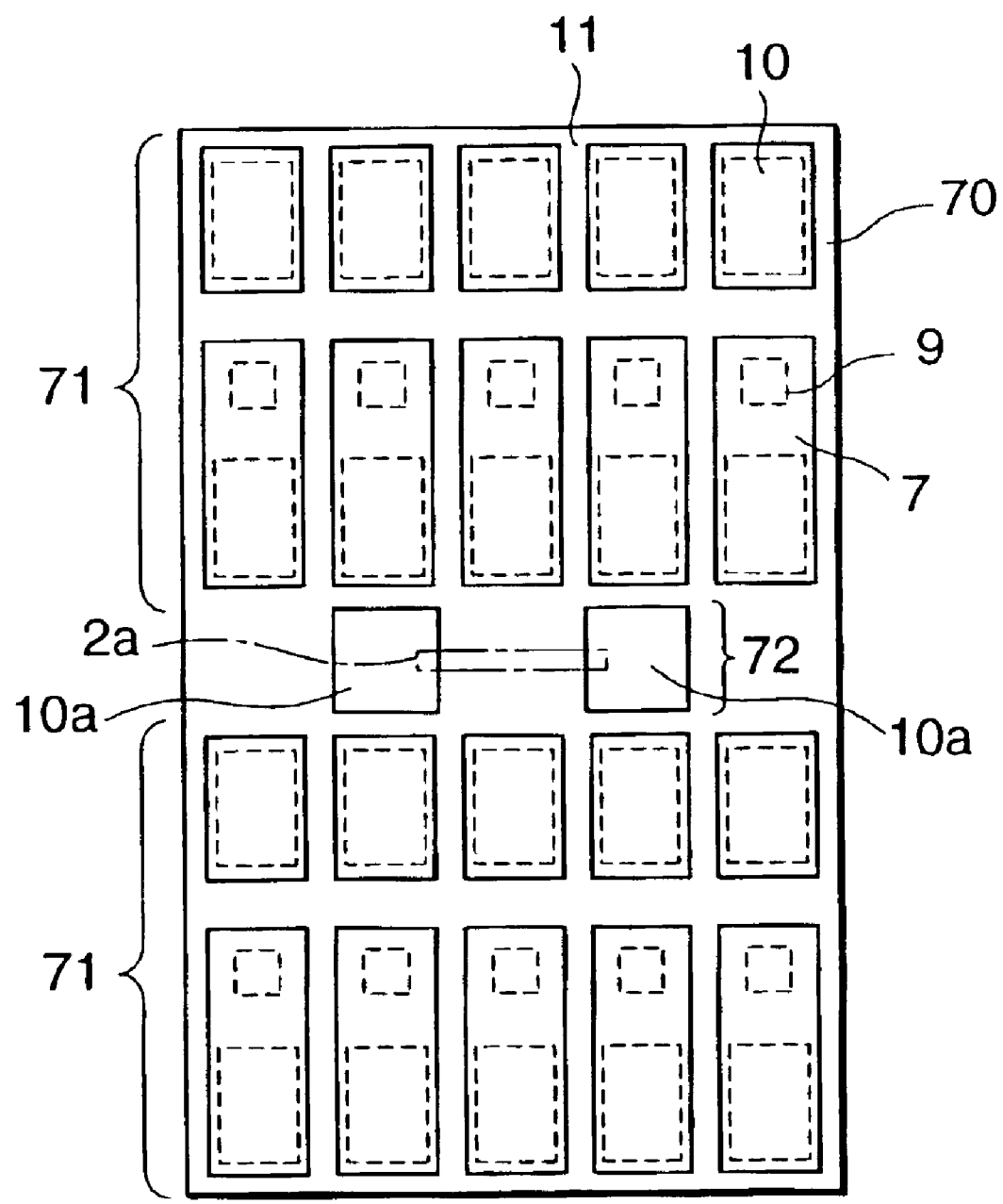
FIG. 15 is a top view of the complex passive component fabricated in Example 8 of the invention.

This example relates to complex passive component including the capacitor of the invention shown in FIG. 9. FIG. 14 is a flowchart illustrating a method for manufacturing the same. First, a polyimide varnish was applied to a silicon wafer 1a by spin coating, and the applied varnish was cured in a nitrogen atmosphere at 400 degrees C., thereby forming a flexible substrate 1. The followings steps from deposition of an adhesion layer (2 in FIG. 9) of the thin film capacitor to formation of an insulating layer (6 in FIG. 9) that assures electrical insulation between a interconnecting pad electrode (7 in FIG. 9) electrically connected to an upper electrode (9 in FIG. 9) of the thin film capacitor and a lower electrode (5 in FIG. 9) are the same as those in Example 1. Then, as a resistive body (2a' in FIG. 9) of the thin film resistor, a TiN film (50 nm thick) and a Cu film (200 nm thick) were deposited successively by reactive sputtering and normal DC sputtering, respectively. The resistive body (2a' in FIG. 9) was made of the same material as the adhesive layer between the interconnecting pad electrode of the thin film capacitor and the insulating layer (6 in FIG. 9) or upper electrode (9 in FIG. 9). Then, a resist film having openings corresponding to the interconnecting pad electrodes to be formed was formed by photolithography, and Cu films were deposited in the openings to a thickness of 12 to 18 $\mu$m by electro-plating, which constituted interconnecting pad electrodes (7, 10, 10a in FIG. 9). The resist film was removed, and then the Cu layer, which is the exposed plating base layer, was removed with an etchant that is ineffective for TiN (for example, sulfuric acid+hydrogen peroxide). Then, a resist film for forming a resistor pattern was formed by photolithography, the TiN films in the openings were removed by etching, and then, the resist was peeled off. Then, a photosensitive epoxy resin was applied to whole of the top surface, and the applied photosensitive epoxy resin was subject to exposure and development, thereby forming a protective layer (11 in FIG. 9) having a thickness of about 2 $\mu$m. At last, the flexible substrate having the thin film capacitor and the thin film resistor formed thereon was peeled off the silicon substrate and cut into individual components. FIG. 15 is a top view of the complex passive component in which 10 thin film capacitors having a capacitance of 1000 pF and one 50-k$\Omega$ thin film resistor formed concurrently therein, for example. The complex passive component was 5.76 mm long by 3.86 mm wide by 40 $\mu$m thick (from the flexible substrate to the protective layer).

Since the thin film capacitor according to the invention has an electrode layer made of a highly elastic material disposed below a dielectric thin film, a thin dielectric film with a high dielectric constant can be formed on a thin flexible substrate with high reliability, and a thin and high-capacity thin film capacitor can be provided with high reliability. Thus, according to the invention, a printed circuit board incorporating the high-capacity capacitor can be thinned, and a flexible substrate incorporating the high-capacity capacitor can be provided. In addition, since the thin film capacitor can be formed on the flexible substrate, the thin film capacitor can be prevented from being damaged when it is incorporated in the printed circuit board. In addition, since the thin film capacitor according to the invention has a interconnecting pad electrode having a thickness of 1 $\mu$m or more formed therein, through-hole connection with a low resistance and high reliability which is not damaged by a thermal cycle can be realized. In addition, in the complex passive component including a thin film capacitor of the invention, or according to the method for manufacturing the same, high-capacity capacitors and thin film resistors or thin film inductors can be integrated on one flexible substrate with a high density, and thus, the printed circuit board incorporating the complex passive component can be reduced in size.

What is claimed is:

1. A thin film capacitor comprising:
    a substrate having a thickness equal to or more than 2 $\mu$m and equal to or less than 100 $\mu$m;
    a lower electrode on said substrate, which includes at least a highly elastic electrode;
    a dielectric thin film on said lower electrode; and
    an upper electrode on said dielectric thin film;
    wherein said highly elastic electrode is made of a material having a Young's modulus equal to or higher than that of Pt.

2. The thin film capacitor according to claim 1,
    wherein said highly elastic electrode is made of an anti-oxidation material.

3. The thin film capacitor according to claim 1,
    further comprising an anti-oxidation electrode on said highly elastic electrode.

4. The thin film capacitor according to claim 3,
    said highly elastic electrode is made of a material having a Young's modulus higher than that of said anti-oxidation electrode.

5. The thin film capacitor according to claim 4,
    wherein said highly elastic electrode has a thickness more than two times the thickness of said dielectric thin film.

6. The thin film capacitor according to claim 5,
    wherein said highly elastic electrode has a thickness about equal to or more than 300 nm.

7. The thin film capacitor according to claims 5,
    wherein said highly elastic electrode is made of at least one metal selected from the group consisting of Ir, Ru, Rh, W, Mo, Fe, Ni, Co and Ta.

8. The thin film capacitor according to claim 5,
    wherein said lower electrode further includes a first adhesion electrode under said highly elastic electrode.

9. The thin film capacitor according to claim 8,
    wherein said lower electrode further includes a second adhesion electrode between said highly elastic electrode and said anti-oxidation electrode.

10. The thin film capacitor according to claim to 9,
    wherein said first adhesion electrode or said second adhesion electrode is made of at least one material selected from the group consisting of of Ti, Cr and Zr.

11. The thin film capacitor according to claim to 5, wherein said anti-oxidation electrode is made of at least one material selected from the group consisting of Pt, Ru, $RuO_2$, $IrO_2$, Pd and Au.

12. The thin film capacitor according to claim to 5, wherein said upper electrode is made of at least one material selected from the group consisting of Pt, Au, Al, TiN, TaN.

13. The thin film capacitor according to claim 5, wherein said dielectric thin film is made of a highly dielectric material.

14. The thin film capacitor according to claim 13, wherein said highly dielectric material is an oxide having a perovskite structure.

15. The thin film capacitor according to claim 5, wherein said substrate is made of a resin film or metal film.

16. The thin film capacitor according to claim 4, wherein said upper electrode and said lower electrode are connected electrically via an upper interconnecting pad electrode and lower interconnecting pad electrode each having a thickness equal to or more than 1 $\mu$m, respectively.

17. The thin film capacitor according to claim 16, further comprising a third adhesion electrode between said lower electrode and said lower interconnecting pad electrode or between said upper electrode and said upper interconnecting pad electrode.

18. The thin film capacitor according to claim 16, further comprising a interconnecting pad electrode receiver which connect to said upper electrode by way of said upper interconnecting pad electrode.

19. The thin film capacitor according to claim 16, wherein said lower interconnecting pad electrode is formed by filling at least one opening penetrating said substrate with a material.

20. The thin film capacitor according to claim 16, wherein said thin film capacitor is covered with an insulating layer having openings go through at least said substrate, said lower electrode or said lower interconnecting pad electrode, and said upper electrode or said upper interconnecting pad electrode.

21. A printed circuit board incorporating a thin film capacitor according to claim 4,
wherein said thin film capacitor is embedded a resin substrate,
said lower electrode is connected electrically via any of a via hole or a through hole or a conductive pattern, and
said upper electrode is connected electrically via any of via hole or a through hole.

22. The printed circuit board incorporating a thin film capacitor according to claim 21,
wherein at least one build-up wiring layer are formed on at least one of main surfaces of said resin substrate.

23. The printed circuit board incorporating a thin film capacitor according to claim 22, said build-up wiring layer is formed with a cured prepreg layer or cured varnish layer serving as an insulating layer.

24. The printed circuit board incorporating a thin film capacitor according to claim 21,
wherein said resin substrate is a flexible substrate.

25. The printed circuit board incorporating a thin film capacitor according to claim 21,
wherein said thin film capacitor is fixed to the conductive pattern formed on said resin substrate by means of a conductive adhesive or solder.

26. The printed circuit board incorporating a thin film capacitor according to claim 21,
wherein an inner layer pattern is formed in said resin substrate.

27. A complex passive component, comprising:
a thin film capacitor according to claim 4 and at least one of a thin film resistor and a spiral inductor formed on a common substrate.

28. The printed circuit board incorporating the complex passive component according to claim 27,
characterized in that said complex passive component is embedded in a resin substrate.

29. A thin film capacitor comprising:
a substrate having a thickness equal to or more than 2 $\mu$m and equal to or less than 100 $\mu$m;
a lower electrode on said substrate, which includes an adhesion electrode and a highly elastic electrode on said adhesive electrode;
a dielectric thin film; and
a upper electrode;
wherein said highly elastic electrode has a thickness more than two times the thickness of said dielectric thin film and made of a material having a Young's modulus higher than that of Pt.

30. A thin film capacitor comprising:
a substrate having a thickness equal to or more than 2 $\mu$m and equal to or less than 100 $\mu$m;
a first lower electrode on said substrate;
a first dielectric thin film on said first lower electrode; and
an first upper electrode on said first dielectric thin film;
a second dielectric thin film on said first upper electrode,
a second lower electrode on said second dielectric thin film,
a third dielectric thin film on said second lower electrode, and
a second upper electrode on said third dielectric thin film,
wherein said second lower electrode is contacted said first lower electrode and is connected electrically via a lower interconnecting pad electrode having a thickness equal to or more than 1 $\mu$m and
said second upper electrode is contacted said first upper electrode and is connected electrically via a upper interconnecting pad electrode having a thickness equal to or more than 1 $\mu$m.

31. A thin film capacitor manufacturing method comprising:
forming a lower electrode on a substrate including forming a highly elastic electrode on said substrate and forming an anti-oxidation electrode on said highly elastic electrode,
forming a dielectric thin film on said lower electrode, and
forming a upper electrode on said dielectric thin film.

32. The thin film capacitor manufacturing method according to claim 31,
further comprising
forming a first adhesion electrode on said substrate and
forming a second adhesion electrode on said highly elastic electrode.

33. The thin film capacitor manufacturing method according to claim 32,
further comprising;
patterning said upper electrode, patterning said dielectric thin film, and patterning said lower electrode.

34. A complex passive component manufacturing method comprising:

manufacturing a thin film capacitor according to the method of claim 33; thereafter forming an insulating layer on said upper electrode;

patterning said insulating layer in such a manner that the insulating layer covers the entire surface of said upper electrode and said dielectric thin film;

depositing an adhesion layer of a interconnecting pad electrode;

forming the interconnecting pad electrode and forming at least one of a thin film resistor and same material as said adhesion layer.

35. The thin film capacitor manufacturing method according to claim 31, wherein said dielectric thin film is formed or annealed in characterized in a temperature that said substrate is a resin substrate, and a higher temperature than a curing temperature of said substrate.

* * * * *